US012776375B2

(12) United States Patent
Li et al.

(10) Patent No.: US 12,776,375 B2
(45) Date of Patent: Oct. 27, 2026

(54) MEMORY DEVICE AND OPERATING METHOD THEREOF, AND MEMORY SYSTEM

(71) Applicant: Yangtze Memory Technologies Co., Ltd., Wuhan (CN)

(72) Inventors: Xinran Li, Wuhan (CN); Feng Xu, Wuhan (CN); Ya Wang, Wuhan (CN); Kaikai You, Wuhan (CN); Da Li, Wuhan (CN); Lei Jin, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 102 days.

(21) Appl. No.: 18/892,263

(22) Filed: Sep. 20, 2024

(65) Prior Publication Data

US 2025/0356924 A1 Nov. 20, 2025

(30) Foreign Application Priority Data

May 14, 2024 (CN) ......................... 202410599469.5

(51) Int. Cl.

*G11C 16/10* (2006.01)
*G11C 16/04* (2006.01)
*G11C 16/32* (2006.01)

(52) U.S. Cl.

CPC ........ *G11C 16/102* (2013.01); *G11C 16/0483* (2013.01); *G11C 16/32* (2013.01)

(58) Field of Classification Search

CPC ... G11C 16/102; G11C 16/0483; G11C 16/32; G11C 16/08; G11C 16/10; G11C 16/3418

See application file for complete search history.

(56) References Cited

U.S. PATENT DOCUMENTS

| | | | | |
|---|---|---|---|---|
| 9,704,587 | B1 | 7/2017 | Park | |
| 11,501,822 | B2 * | 11/2022 | Jia | G11C 11/4085 |
| 2017/0200504 | A1 * | 7/2017 | Park | G11C 16/0483 |
| 2019/0279726 | A1 | 9/2019 | Li et al. | |
| 2020/0411073 | A1 * | 12/2020 | Hwang | G11C 16/08 |
| 2023/0397446 | A1 * | 12/2023 | Nakaki | G11C 16/26 |
| 2025/0245176 | A1 | 7/2025 | Cui et al. | |

* cited by examiner

*Primary Examiner* — Xiaochun L Chen

(74) *Attorney, Agent, or Firm* — Fish & Richardson P.C.

(57) ABSTRACT

The present application provides memory devices, operating methods, and memory systems. An example memory device includes: a first, second, and third top select line, multiple word lines, multiple memory cells, and a peripheral circuit configured to: in a process of programming the multiple memory cells coupled to a selected word line of the multiple word lines, dynamically adjust an application approach of a select voltage on the second top select line depending on a distance between the selected word line and the third top select line; wherein when the first top select line reaches its select voltage is different from when the third top select line reaches its select voltage, and when the second top select line reaches its select voltage is not earlier than when the first top select line reaches its select voltage and not later than when the third top select line reaches its select voltage.

20 Claims, 11 Drawing Sheets

MEMORY DEVICE AND OPERATING METHOD THEREOF, AND MEMORY SYSTEM

CROSS-REFERENCE TO RELATED APPLICATIONS

This application claims priority to Chinese Patent Application No. 202410599469.5, filed on May 14, 2024. The disclosure of the aforementioned application is hereby incorporated by reference in its entirety.

FIELD OF TECHNOLOGY

Embodiments of the present application relate to the field of semiconductor technology, and in particular to memory device and operating method thereof, and memory system.

BACKGROUND

A memory device is a memory apparatus used to preserve information in modern information technology. As a typical non-volatile semiconductor memory, Not-And (NAND) flash memory has become a mainstream product in the storage market due to its high storage density, controllable production cost, suitable program and erase speed and retention characteristics.

SUMMARY

Embodiments of the present application propose memory device and operating method thereof and memory system.

In a first aspect, an embodiment of the present application provides a memory device, the memory device includes a first top select line, a second top select line, a third top select line, and multiple word lines stacked in sequence; multiple memory cells coupled to each word line; a peripheral circuit coupled to the first top select line, the second top select line, the third top select line, and the multiple word lines, wherein the peripheral circuit is configured to: in the process of programming the multiple memory cells coupled to a selected word line of the multiple word lines, dynamically adjust an application approach of a select voltage on the second top select line depending on a distance between the selected word line and the third top select line; wherein an instant of time when the first top select line reaches its select voltage is different from an instant of time when the third top select line reaches its select voltage, and an instant of time when the second top select line reaches its select voltage is not earlier than the instant of time when the first top select line reaches its select voltage and not later than the instant of time when the third top select line reaches its select voltage.

In some embodiments, the peripheral circuit is configured to: based on the distance between the selected word line and the third top select line being less than a first preset distance, control the instant of time when the second top select line reaches its select voltage to be the same as the instant of time when the third top select line reaches its select voltage; and based on the distance between the selected word line and the third top select line being greater than a second preset distance, control the instant of time when the second top select line reaches its select voltage to be the same as the instant of time when the first top select line reaches its select voltage, wherein the second preset distance is greater than or equal to the first preset distance.

In some embodiments, the memory device further includes a top select line isolation structure, wherein the top select line isolation structure penetrates the first top select line and partially penetrates the second top select line, and the deeper a depth of the top select line isolation structure penetrating the second top select line, the larger a value of the corresponding second preset distance.

In some embodiments, the peripheral circuit is configured such that: based on the distance between the selected word line and the third top select line being less than the first preset distance, a voltage magnitude of the select voltage applied to the second top select line is the same as a voltage magnitude of the select voltage applied to the third top select line; and based on the distance between the selected word line and the third top select line being greater than the second preset distance, the voltage magnitude of the select voltage applied to the second top select line is the same as a voltage magnitude of the select voltage applied to the first top select line.

In some embodiments, the voltage magnitude of the select voltage applied to the first top select line is different from the voltage magnitude of the select voltage applied to the third top select line.

In some embodiments, the peripheral circuit includes a first voltage generation circuit configured to provide a select voltage for the first top select line; and a second voltage generation circuit configured to provide a select voltage for the third top select line; and the peripheral circuit is configured to: based on the distance between the selected word line and the third top select line being less than the first preset distance, supply power to the second top select line by using the second voltage generation circuit; and based on the distance between the selected word line and the third top select line being greater than the first preset distance, supply power to the second top select line by using the first voltage generation circuit.

In some embodiments, the peripheral circuit is configured to: based on the distance between the selected word line and the third top select line being greater than or equal to the first preset distance and less than or equal to the second preset distance, control the instant of time when the second top select line reaches its select voltage to be the same as the instant of time when the first top select line reaches its select voltage.

In some embodiments, the peripheral circuit is configured such that: based on the distance between the selected word line and the third top select line being less than the first preset distance, a start instant of time for the select voltage applied to the second top select line is later than a start instant of time for the select voltage applied to the first top select line; and based on the distance between the selected word line and the third top select line being greater than the second preset distance, the start instant of time for the select voltage applied to the second top select line is earlier than the start instant of time for the select voltage applied to the third top select line.

In some embodiments, the peripheral circuit is configured to implement at least one of the following: when applying select voltages to the first top select line and the third top select line, a start instant of time for the select voltage applied to the first top select line is different from a start instant of time for the select voltage applied to the third top select line; controlling a lifting rate for the first top select line to reach its select voltage to be different from a lifting rate for the third top select line to reach its select voltage; controlling the number of lifting times for the first top select line to reach its select voltage to be different from the number of lifting times for the third top select line to reach its select voltage.

In some embodiments, the peripheral circuit is configured to implement at least one of the following: when applying select voltages to the first top select line and the third top select line, the start instant of time for the select voltage applied to the first top select line is earlier than the start instant of time for the select voltage applied to the third top select line; controlling the lifting rate for the first top select line to reach its select voltage to be greater than the lifting rate for the third top select line to reach its select voltage; controlling the number of lifting times for the first top select line to reach its select voltage to be less than the number of lifting times for the third top select line to reach its select voltage.

In a second aspect, an embodiment of the present application further provides a memory device, including a first top select line, a second top select line, a third top select line, and multiple word lines stacked in sequence; multiple memory cells coupled to each word line; a peripheral circuit coupled to the first top select line, the second top select line, the third top select line, and the multiple word lines, wherein the peripheral circuit is configured to: in a first program stage, apply a first program voltage to a first word line; in the first program stage, apply a first select voltage to the first top select line, apply a second select voltage to the second top select line, and apply a third select voltage to the third top select line; in a second program stage, apply a second program voltage to a second word line; in the second program stage, apply the first select voltage to the first top select line, apply a fourth select voltage to the second top select line, and apply the third select voltage to the third top select line; wherein in the first program stage, an instant of time when the second top select line reaches the second select voltage is different from an instant of time when the first top select line reaches the first select voltage, and in the second program stage, an instant of time when the second top select line reaches the fourth select voltage is different from an instant of time when the third top select line reaches the third select voltage.

In some embodiments, a distance between the first word line and the third top select line is less than a distance between the second word line and the third top select line; in the first program stage, the instant of time when the second top select line reaches the second select voltage is later than the instant of time when the first top select line reaches the first select voltage; and in the second program stage, the instant of time when the second top select line reaches the fourth select voltage is earlier than the instant of time when the third top select line reaches the third select voltage.

In some embodiments, a voltage magnitude of the second select voltage is the same as or different from a voltage magnitude of the fourth select voltage.

In some embodiments, a distance between the first word line and the third top select line is less than a first preset distance, and in the first program stage, the instant of time when the second top select line reaches the second select voltage is the same as the instant of time when the third top select line reaches the third select voltage; and a distance between the second word line and the third top select line is greater than a second preset distance, and the instant of time when the second top select line reaches the fourth select voltage is the same as the instant of time when the first top select line reaches the first select voltage.

In some embodiments, a voltage magnitude of the second select voltage is the same as a voltage magnitude of the third select voltage, and a voltage magnitude of the fourth select voltage is the same as a voltage magnitude of the first select voltage.

In some embodiments, the peripheral circuit is configured to implement at least one of the following: controlling, in the first program stage, an instant of time to start to apply the second select voltage to be later than an instant of time to start to apply the first select voltage, and in the second program stage, an instant of time to start to apply the fourth select voltage to be earlier than an instant of time to start to apply the third select voltage; controlling a lifting rate for the second top select line to reach the second select voltage in the first program stage to be greater than a lifting rate for the second top select line to reach the fourth select voltage in the second program stage; controlling the number of lifting times for the second top select line to reach the second select voltage in the first program stage to be less than the number of lifting times for the second top select line to reach the fourth select voltage in the second program stage.

In a third aspect, an embodiment of the present application further provides a memory system, including: one or more memory devices of one or more embodiments of the present application; and a memory controller coupled to and controlling the memory device.

In a fourth aspect, an embodiment of the present application further provides an operating method for a memory device, wherein the memory device includes a first top select line, a second top select line, a third top select line, and multiple word lines stacked in sequence, and the operating method includes: in the process of programming multiple memory cells coupled to a selected word line of the multiple word lines, dynamically adjusting an application approach of a select voltage on the second top select line according to different distances between the selected word line and the third top select line; wherein an instant of time when the first top select line reaches its select voltage is different from an instant of time when the third top select line reaches its select voltage, and an instant of time when the second top select line reaches its select voltage is not earlier than an instant of time when the first top select line reaches its select voltage and not later than an instant of time when the third top select line reaches its select voltage.

In some embodiments, dynamically adjusting the application approach of the select voltage on the second top select line depending on the distance between the selected word line and the third top select line comprises: based on the distance between the selected word line and the third top select line being less than a first preset distance, controlling the instant of time when the second top select line reaches its select voltage to be the same as the instant of time when the third top select line reaches its select voltage; and based on the distance between the selected word line and the third top select line being greater than a second preset distance, controlling the instant of time when the second top select line reaches its select voltage to be the same as the instant of time when the first top select line reaches its select voltage, wherein the second preset distance is greater than or equal to the first preset distance.

In some embodiments, the memory device further includes a top select line isolation structure, wherein the top select line isolation structure penetrates the first top select line and partially penetrates the second top select line, and the deeper a depth of the top select line isolation structure penetrating the second top select line, the larger a value of the corresponding second preset distance.

In some embodiments, the method further includes: based on the distance between the selected word line and the third top select line being less than the first preset distance, a voltage magnitude of the select voltage applied to the second top select line is the same as a voltage magnitude of the select voltage applied to the third top select line; and based on the distance between the selected word line and the third top select line being greater than the second preset distance, the voltage magnitude of the select voltage applied to the second top select line is the same as a voltage magnitude of the select voltage applied to the first top select line.

In some embodiments, the voltage magnitude of the select voltage applied to the first top select line is different from the voltage magnitude of the select voltage applied to the third top select line.

In some embodiments, the method further includes: based on the distance between the selected word line and the third top select line being greater than or equal to the first preset distance and less than or equal to the second preset distance, control the instant of time when the second top select line reaches its select voltage to be the same as the instant of time when the first top select line reaches its select voltage.

In some embodiments, the method further includes: based on the distance between the selected word line and the third top select line being less than the first preset distance, a start instant of time of the select voltage applied to the second top select line is later than a start instant of time for the select voltage applied to the first top select line; and based on the distance between the selected word line and the third top select line being greater than the second preset distance, the start instant of time for the select voltage applied to the second top select line is earlier than the start instant of time of the select voltage applied to the third top select line.

In some embodiments, the method further includes at least one of the following: when applying select voltages to the first top select line and the third top select line, the start instant of time for the select voltage applied to the first top select line is different from the start instant of time for the select voltage applied to the third top select line; controlling a lifting rate for the first top select line to reach its select voltage to be different from a lifting rate for the third top select line to reach its select voltage; control the number of lifting times for the first top select line to reach its select voltage to be different from the number of lifting times for the third top select line to reach its select voltage.

In the embodiment of the present application, a first top select line, a second top select line and a third top select line are sequentially stacked on the word line of the memory device, wherein the third top select line is closest to the word line, and the first top select line to the third top select line divide the memory block in the memory cell array into multiple finger storage areas, the first top select line and the third top select line have slightly different functional emphases, and based on this, the instant of time when the first top select line reaches its select voltage is different from the instant of time when the third top select line reaches its select voltage. Considering that the program crosstalk of the memory cells coupled with the selected word lines at different distances from the top select line is affected at different points, e.g., the program crosstalk of the far-end word line is seriously affected by the voltage spike coupling of the select gate on the select line, while the program crosstalk of the near-end word line is affected by the turn-off capability of the select gate on the select line, the peripheral circuit of the memory device dynamically adjusts the application approach of the select voltage on the second top select line according to the different distances between the selected word line and the third top select line during the program operation on the multiple memory cells coupled to the selected word line, so that the instant of time when the second top select line reaches its select voltage is not earlier than the instant of time when the first top select line reaches its select voltage and is not later than the instant of time when the third top select line reaches its select voltage. In this way, the application approach of the select voltage on the second top select line may be flexibly set according to the distance between the selected word line and the top select line, so as to better suppress program crosstalk in different situations.

DETAILED DESCRIPTION

Figure 1:
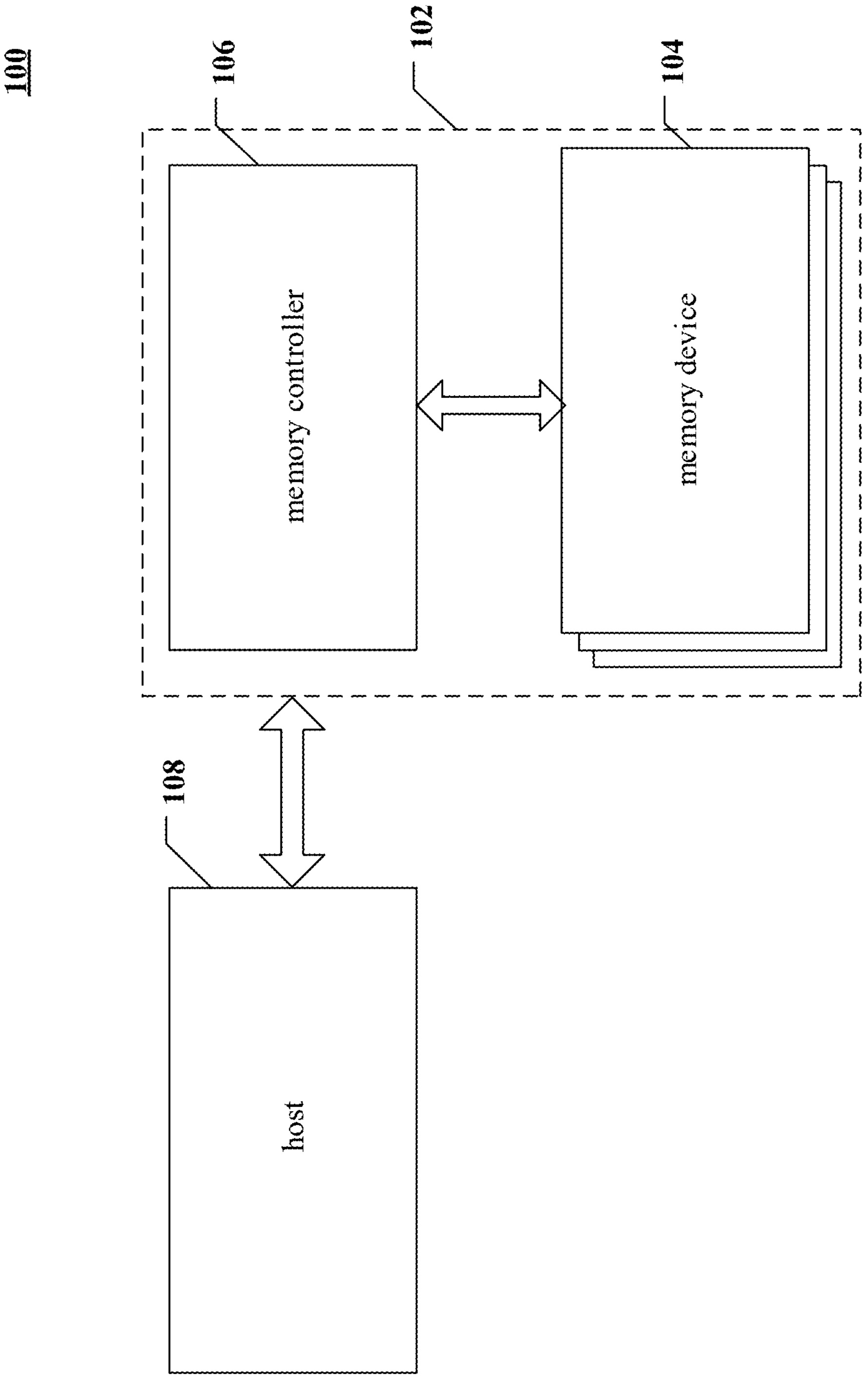
FIG. 1 is a schematic diagram of an exemplary system with a memory system of an embodiment according to the present application.

Exemplary implementations applied in the present application will be described in more detail below with reference to the accompanying drawings. Although exemplary implementations of the present application are shown in the accompanying drawings, it is to be understood that the present application may be implemented in various forms and should not be limited to the implementations set forth herein. Rather, these embodiments are provided so that the present application can be more thoroughly understood and the scope of the present application can be fully conveyed to those skilled in the art.

In the following description, numerous details are given in order to provide a more thorough understanding of the present application. However, it will be apparent to one skilled in the art that the present application may be practiced without one or more of these details. In other examples, in order to avoid confusion with the present application, some technical features known in the art are not described; that is, not all features of the actual embodiment are described here, and well-known functions and structures are not described in detail.

In the accompanying drawings, size of a layer, a region, an element and their relative sizes may be exaggerated for clarity. Like reference numerals refer to like elements throughout.

It will be understood that when an element or layer is referred to as being "on," "adjacent to," "connected to" or "coupled to" another element or layer, it may be directly on, adjacent to, connected to or coupled to another element or layer, or intervening elements or layers may be present. In contrast, when an element is referred to as being "directly on," "directly adjacent to," "directly connected to" or "directly coupled to" another element or layer, there is no intervening elements or layers present. It will be understood that, although the terms first, second, third etc., may be used to describe various elements, components, regions, layers and/or parts, these elements, components, regions, layers and/or parts should not be limited by these terms. These terms are only used to distinguish one element, component, region, layer or part from another element, component, region, layer or part. Thus, a first element, component, region, layer or part discussed below may be termed as a second element, component, region, layer or part without departing from teachings of the present application. Whereas a second element, component, region, layer or part is discussed, it does not indicate that a first element, component, region, layer or part necessarily presents in the present application.

The spatially relative terms such as "beneath", "below", "lower", "under", "above", "on", etc., may be used herein for ease of description to describe one element or feature's relationship to another element(s) or feature(s) as illustrated in the figures. It will be understood that the spatially relative terms are intended to encompass different orientations of the device in use or operations in addition to the orientation depicted in the drawings. For example, if the device in the appended drawings is turned over, an element or a feature described as "below" or "beneath" or "under" another element or feature would then be oriented "above" the other element or feature. Thus, exemplary terms "below" and "under" may encompass both directions of up and down. A device may be otherwise oriented (rotated 90 degrees or at other orientations) and the spatially relative descriptors used herein is to be interpreted accordingly.

A term used herein is for the purpose of describing a particular embodiment only and is not to be considered as limitation of the present application. As used herein, the singular forms "a", "an" and "said/the" are intended to include the plural forms as well, unless the context clearly dictates otherwise. It should also be understood that the terms "consists of" and/or "comprising", when used in this description, identify the presence of stated features, integers, steps, operations, elements and/or parts, but do not exclude the presence or addition of one or more other features, integers, steps, operations, elements, parts and/or groups. As used herein, the term "and/or" includes any and all combinations of the associated listed items.

In order to understand the characteristics and technical content of embodiments of the present application in more detail, implementations of embodiments of the present application will be described in detail below in conjunction with the accompanying drawings, however, the accompanying drawings are for reference and description only, and are not intended to limit embodiments of the present application.

Memory devices in embodiments of the present application include but are not limited to a three-dimensional NAND memory, and for ease of understanding, a three-dimensional NAND memory is used as an example for illustration.

FIG. 1 illustrates a block diagram of an exemplary system 100 with memory devices in accordance with some aspects of the present application. The system 100 may be a mobile phone, a desktop computer, a laptop computer, a tablet, a vehicle computer, a gaming console, a printer, a positioning device, a wearable electronic device, a smart sensor, a Virtual Reality (VR) device, an Augment Reality (AR) device, or any other suitable electronic devices having memory therein. As shown in in FIG. 1, system 100 may include a host 108 and a memory system 102, and the memory system 102 has one or more memory devices 104 and a memory controller 106. The host 108 may be a control unit of an electronic device (e.g., a Central Processing Unit (CPU)) or a System of Chip (SoC) (e.g., an Application Processor (AP)). Host 108 may be configured to send data to or receive data from memory device 104.

According to some implementations, memory controller 106 is coupled to memory device 104 and host 108 and is configured to control memory device 104. Memory controller 106 may manage data stored in memory device 104 and communicate with host 108. In some implementations, the memory controller 106 is designed to operate in low duty cycle environments, e.g., Secure Digital (SD) card, Compact Flash (CF) card, Universal Serial Bus (USB) flash drive, or other media for use in electronic devices such as personal computer, digital camera, mobile phone, etc.

In some implementations, the memory controller 106 is designed to operate in high duty cycle environment Solid State Drive (SSD) or Embedded Multi Media Card (eMMC), where SSD or eMMC is used as data memory for mobile devices such as smartphone, tablet computer, laptop computer, and enterprise storage array.

Memory controller 106 may be configured to control operations of memory device 104, e.g., read, erase and program operations. Memory controller 106 may also be configured to manage various functions related to data stored or to be stored in memory device 104, including but not limited to bad block management, garbage collection, logical-to-physical address translation, wear leveling, etc. In some implementations, memory controller 106 is also configured to process error correction code related to data read from or written to memory device 104.

The memory controller 106 may also perform any other suitable functions, e.g., formatting the memory device 104. Memory controller 106 may communicate with external devices (e.g., host 108) according to a particular communication protocol. For example, the memory controller 106 may communicate with external devices through at least one of various interface protocols, such as USB protocol, MMC protocol, Peripheral Component Interconnection (PCI) protocol, PCI Express (PCI-E) protocol, Advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

The memory controller 106 and one or more memory device 104 may be integrated into various types of storage devices, e.g., included in the same package (e.g., Universal Flash Storage (UFS) package or eMMC package). That is, memory system 102 may be implemented and packaged into different types of end electronic products.

Figure 2A:
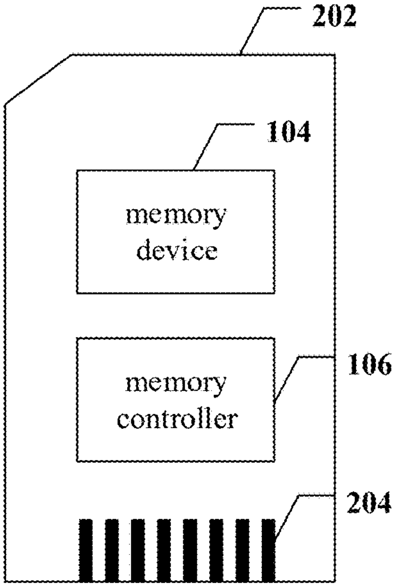
FIG. 2*a* is a schematic diagram of an exemplary memory card with a memory system according to an embodiment of the present application.

In one example as shown in FIG. 2*a*, memory controller 106 and a single memory device 104 may be integrated into a memory card 202. Memory card 202 may include a PC card (PCMCIA, personal computer memory card international association), a CF card, a smart media (SM) card, a memory stick, a mulinstant of timedia card (MMC, RS-MMC, MMCmicro), an SD card (SD, miniSD, microSD, SDHC), a UFS, etc. Memory card 202 may further include a memory card connector 24 coupling memory card 202 with a host (e.g., host 108 in FIG. 1).

Figure 2B:
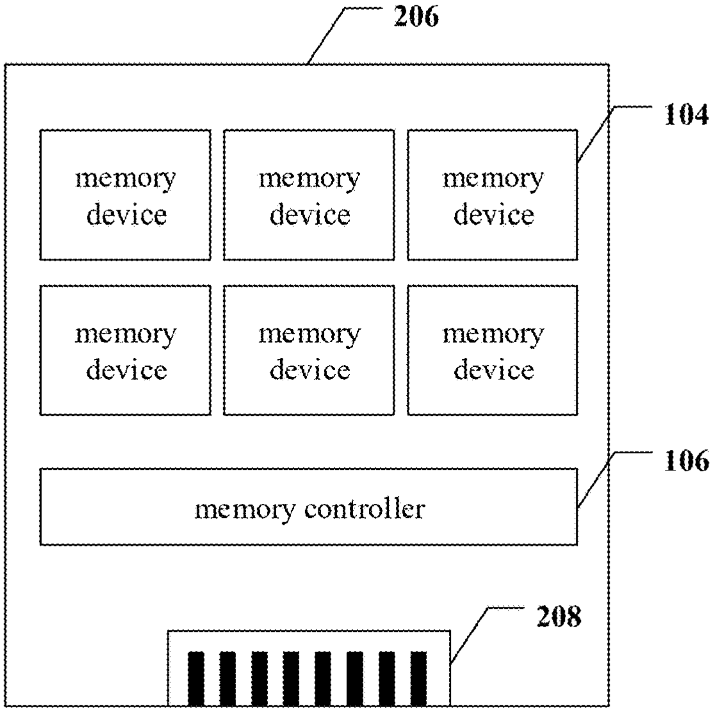
FIG. 2*b* is a schematic diagram of an exemplary solid state drive with a memory system according to an embodiment of the present application.

In another example as shown in FIG. 2*b*, memory controller 106 and multiple memory devices 104 may be integrated into a SSD 206. The SSD 206 may further include an SSD connector 208 coupling the SSD 206 with a host (e.g., host 108 in FIG. 1). In some implementations, the storage capacity and/or operating speed of the SSD 206 is greater than the storage capacity and/or operating speed of memory card 202.

In some embodiments, each memory block may be coupled to multiple word lines, and multiple memory cells coupled to each word line constitute a physical page.

Figure 3:
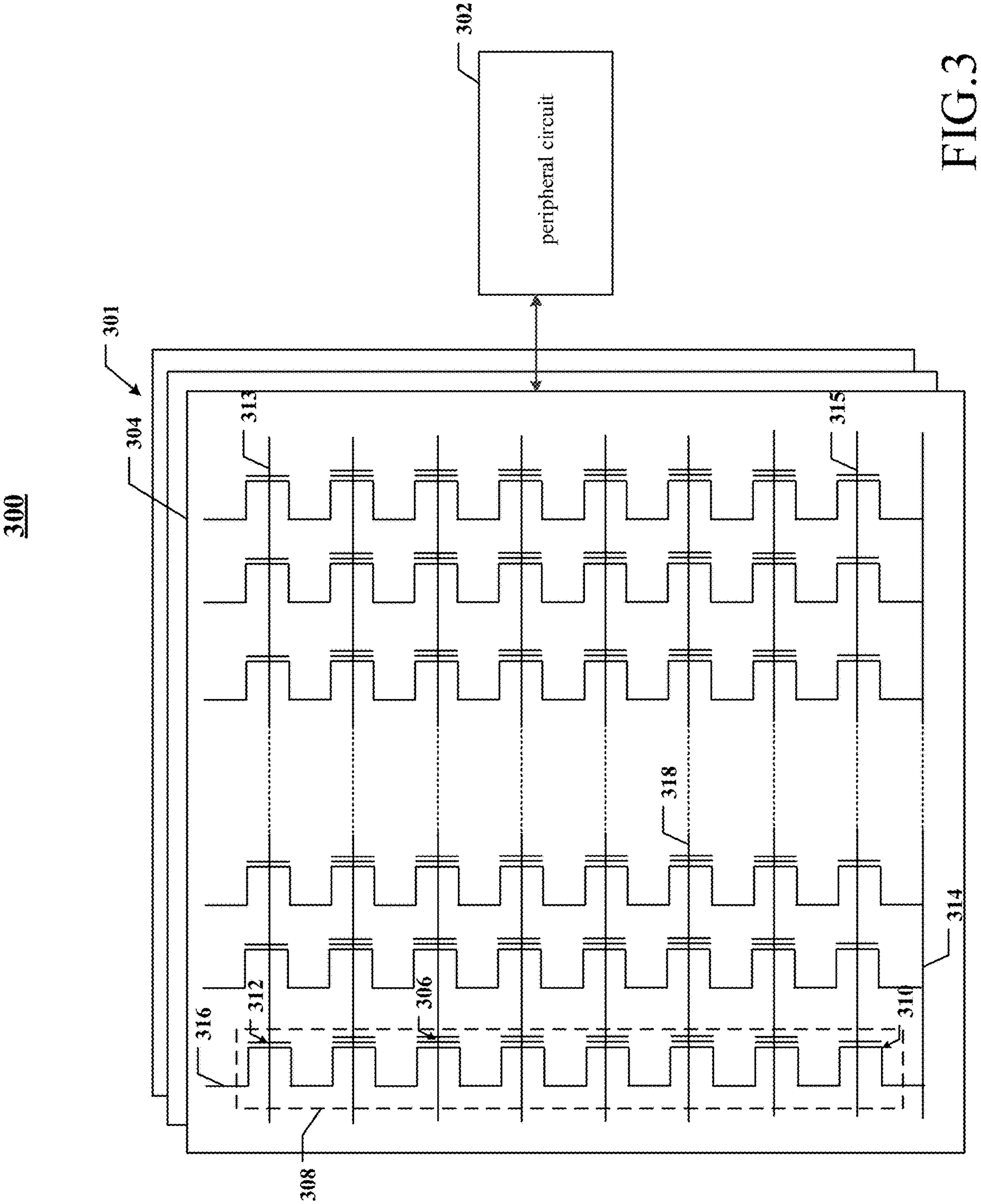
FIG. 3 is a schematic diagram of an exemplary memory device including peripheral circuits according to an embodiment of the present application.

FIG. 3 illustrates a schematic circuit diagram of an exemplary memory device 300 including peripheral circuitry according to some aspects of the present application. Memory device 300 may be an example of memory device 104 in FIG. 1. The memory device 300 may include a memory cell array 301 and a peripheral circuit 302 coupled to the memory cell array 301. Taking memory cell array 301 being a three-dimensional NAND-type memory cell array as an example for illustration, where memory cells 306 are NAND-type memory cells, and memory cells 306 are provided in the form of an array of memory strings 308, each memory string 308 extending vertically over a substrate (not shown). In some implementations, each memory string 308 includes multiple memory cells 306 coupled in series and stacked vertically. Each memory cell 306 may retain a continuous analog value, e.g., voltage or charge, depending on the number of electrons trapped within the region of the memory cell 306. Each memory cell 306 may be a "floating gate" type memory cell including a floating gate transistor, or a "charge trap" type memory cell including a charge trap transistor.

In some implementations, each memory cell 306 is a Single-level Cell (SLC) that has two possible memory states and may thus store one bit of data. For example, a first memory state of "0" may correspond to a first voltage range, and a second memory state of "1" may correspond to a second voltage range. In some implementations, each memory cell 306 is a Multi-Level Cell (MLC) capable of storing more than a single bit of data in more than four memory states. For example, an MLC may store two bits per cell (also known as a Double-Level Cell), three bits per cell (also known as a Trinary-Level Cell (TLC)), four bits per cell (also known as a Quad-Level Cell (QLC)), five bits per cell (also known as a Penta-level cell (PLC)), or more than five bits per cell. Each MLC can be programmed to assume a range of possible nominal storage values. In one example, if each MLC stores two bits of data, the MLC can be programmed to assume one of three possible program levels from the erased state through writing one of three possible nominal storage values into the cell, a fourth nominal storage value may be used for the erase state.

It is to be noted that the storage state mentioned here is also the storage state of the memory cell mentioned in this application. Different memory cells have different numbers of storage states. e.g., a SLC type memory cell has two storage states (i.e., two memory states), where the two storage states include a program state and an erase state. As another example, an MLC type memory cell has four storage states, where the four storage states include one erase state and three program states. As yet another example, a TLC type memory cell has eight storage states, where the eight storage states include one erase state and seven program states. In some implementation, the QLC type memory cell has sixteen storage states, where the sixteen storage states include one erase state and fifteen program states.

As shown in FIG. 3, each memory string 308 may include a bottom select gate (BSG) 310 (also referred to as a source side select gate) at its source terminal and a top select gate (TSG) 312 (also referred to as a drain side select gate) at its drain terminal. BSG 310 and TSG 312 may be configured to activate the selected memory cell string 308 during read operation and program operation. In some implementations, the sources of memory strings 308 in a same memory block 304 are coupled through a same source line (SL) 314 (e.g., a common SL). In other words, according to some implementations, all memory strings 308 in a same memory block 304 have an array common source (ACS). According to some implementations, TSG 312 of each memory string 308 is coupled to a corresponding bit line (BL) 316 from which data may be read or written via an output bus (not shown). In some implementations, each memory string 308 is configured to be selected or deselected through applying a select voltage (e.g., above the threshold voltage of a transistor with a TSG 312) or a deselect voltage (e.g., 0V) to the corresponding TSG 312 via one or more top select lines 313 and/or applying a select voltage (e.g., above the threshold voltage of a transistor with a BSG 310) or a deselect voltage (e.g., 0V) to the corresponding BSG 310 via one or more bottom select lines 315.

As also shown in FIG. 3, a memory string 308 may be organized into multiple memory blocks 304 each of which may have a common source line 314 (e.g., coupled to ground). In some implementations, each memory block 304 is the basic data unit for an erase operation, i.e., all memory cells 306 on the same memory block 304 are erased simultaneously. To erase the memory cell 306 in the selected memory block 304, the source line 314 coupled to the selected memory block 304 and to the unselected memory blocks 304 in the same plane as the selected memory block 304 may be biased with an erase voltage (Vers) (e.g., a high positive voltage (e.g., 20V or higher)). It is to be understood that, in some examples, erase operations may be performed at the half-memory block level, at the quarter-memory block level, or at a level with any suitable number of memory blocks or any suitable fraction of memory blocks. The memory cells 306 of adjacent memory strings 308 may be coupled through a word line 318 that selects which row of memory cells 306 is affected by read and program operations.

Referring to FIG. 3, each memory cell 306 of the multiple memory cells is coupled to a corresponding word line 318, and each memory string 308 is coupled to a corresponding bit line 316 through a corresponding select transistor (e.g., top select transistor (TSG) 312).

Figure 4:
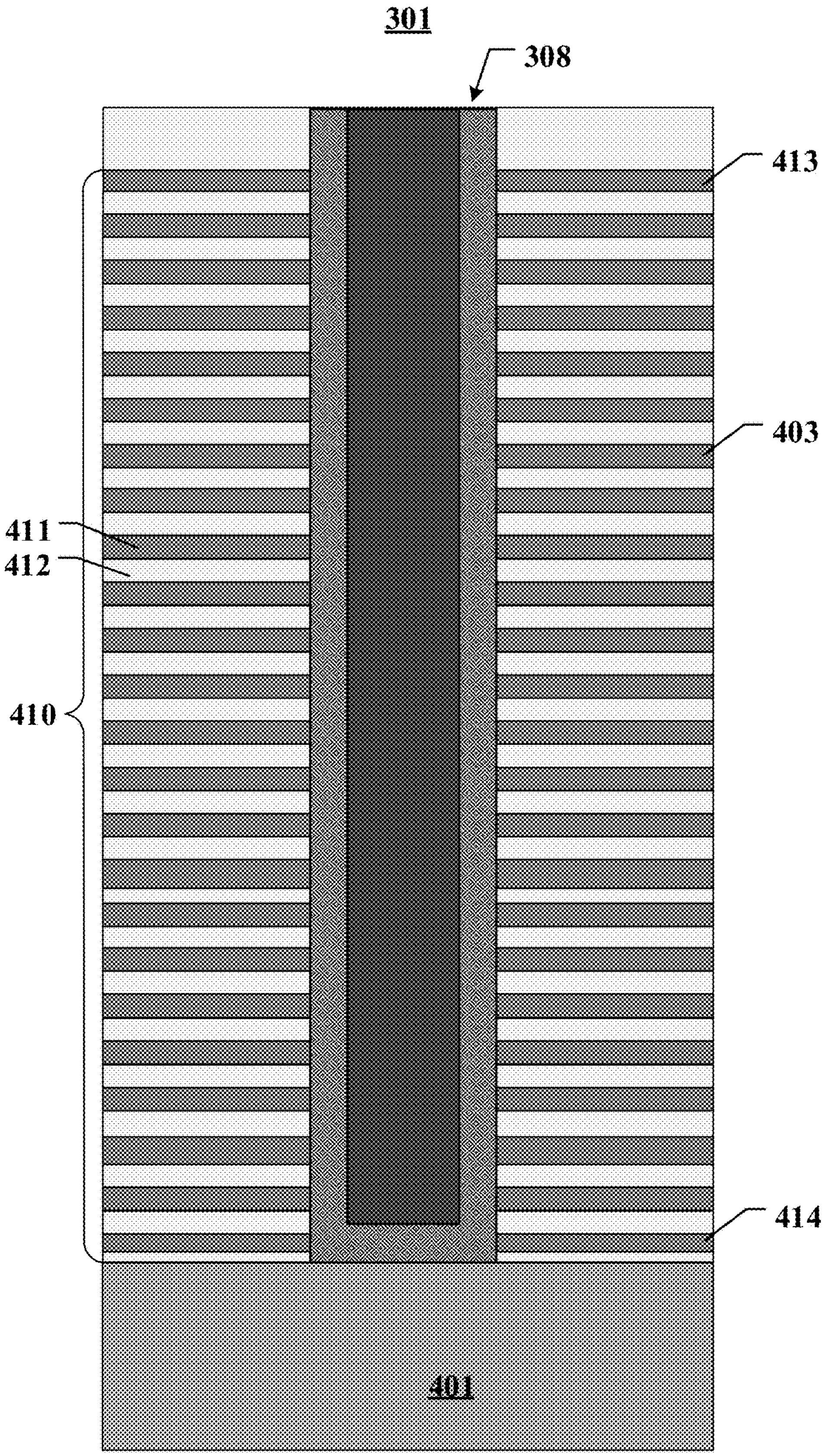
FIG. 4 is a schematic cross-sectional view of a memory cell array including NAND-type memory strings according to an embodiment of the present application.

FIG. 4 illustrates a schematic cross-sectional view of an exemplary memory cell array 301 including memory strings 308, e.g., NAND, according to some aspects of the present application. As shown in FIG. 4, the NAND memory cell array 301 may include a stacked structure 410, the stacked structure 410 includes multiple gate layers 411 and multiple insulating layers 412 alternately stacked in sequence, and the channel structure vertically penetrating through the gate layers 411 and the insulating layers 412, wherein the channel structure is coupled to each gate layer to form a memory cell, and the channel structure is coupled to multiple gate layers in the stacked structure 410 to form the memory string 308. Gate layers 411 and the insulating layers 412 may be stacked alternately, and two adjacent gate layers 411 are separated by an insulating layer 412.

A constituent material of the gate layer 411 may include a conductive material. Conductive materials include, but are not limited to, tungsten (W), cobalt (Co), copper (Cu), aluminum (Al), polysilicon, doped silicon, silicide, or any combination thereof. In some embodiments, each gate layer 411 includes a metal layer, e.g., a tungsten layer. In some embodiments, each gate layer 411 includes a doped polysilicon layer. Each gate layer 411 may include a control gate surrounding a memory cell. A gate layer 411 at the top of a stacked structure 410 may extend laterally as a top select gate line, a gate layer 411 at the bottom of a stacked structure 410 may extend laterally as a bottom select gate line, and a gate layer 411 extending laterally between a top select gate line and a bottom select gate line may serve as a word line layer.

In some embodiments, a stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other appropriate material.

In some embodiments, a memory string 308 includes a channel structure extending vertically through stacked structure 410. In some implementations, a channel structure includes a channel hole filled with semiconductor material(s) (e.g., as a semiconductor channel) and dielectric material(s) (e.g., as a memory film). In some implementations, a semiconductor channel includes silicon, e.g., polysilicon. In some implementations, a memory film is a composite insulating layer including a tunneling layer, a storage layer (also referred to as a "charge trapping/storage layer"), and a blocking layer. A channel structure may have a cylindrical shape (e.g., a pillar shape). According to some implementations, a semiconductor channel, a tunneling layer, a storage layer and a blocking layer are radially arranged in this order from the center of the pillar toward the outer surface of the pillar. A tunneling layer may include silicon oxide, silicon oxynitride, or any combination thereof. A storage layer may include silicon nitride, silicon oxynitride, or any combination thereof. A blocking layer may include silicon oxide, silicon oxynitride, a high-k (high-k) dielectric, or any combination thereof. In an example, a memory film may include a composite layer of silicon oxide/silicon oxynitride/silicon oxide (ONO).

Figure 5:
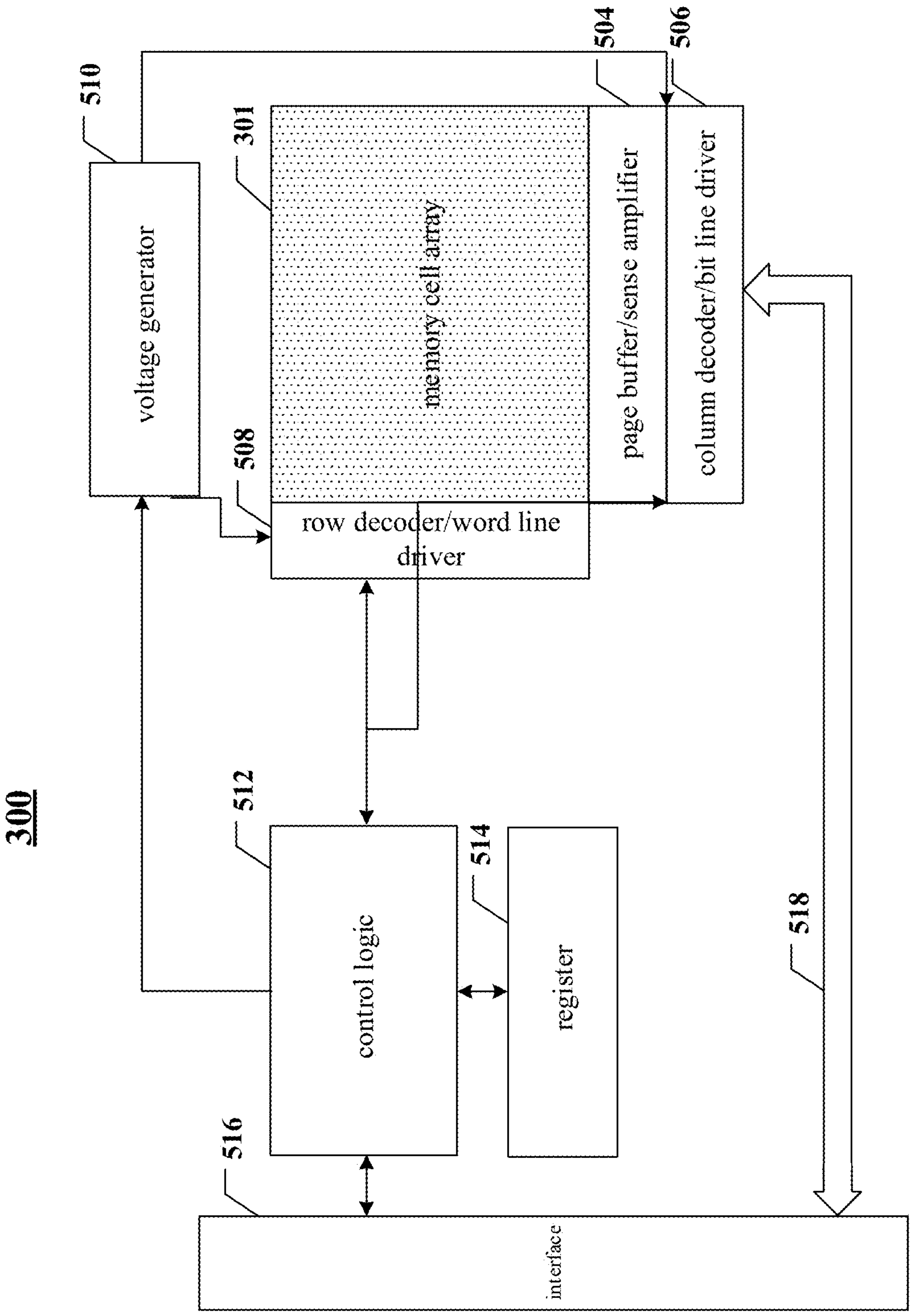
FIG. 5 is a schematic diagram of an exemplary memory device including a memory cell array and peripheral circuits according to an embodiment of the present application.

Referring back to FIG. 3, the peripheral circuit 302 may be coupled to the memory cell array 301 through bit line 316, word line 318, source line 314, BSG line 315, and TSG line 313. The peripheral circuit 302 may include any suitable analog, digital, and mixed-signal circuitry for facilitating operation of the memory cell array 301 through applying a voltage signal and/or a current signal to and sensing voltage signal and/or current signal from each target memory cell 306 via bit line 316, word line 318, source line 314, BSG line 315, and TSG line 313. The peripheral circuit 302 may include various types of peripheral circuits formed with metal-oxide-semiconductor (MOS) technology. For example, FIG. 5 illustrates some exemplary peripheral circuits, the peripheral circuit includes page buffer/sense amplifier 504, column decoder/bit line driver 506, row decoder/word line driver 508, voltage generator 510, control logic 512, register 514, interface 516 and data bus 518. It is to be understood that in some examples, additional peripheral circuits not shown in FIG. 5 may also be included.

The page buffer/sense amplifier 504 may be configured to read data from and program (write) data to the memory cell array 301 according to control signals from the control logic 512. In one example, the page buffer/sense amplifier 504 may store program data (written data) to be programmed into the memory cell array 301. In another example, the page buffer/sense amplifier 504 may perform a program verify operation to ensure that data has been correctly programmed into memory cell 306 coupled to selected word line 318. In yet another example, the page buffer/sense amplifier 504 may also sense a low power signal from bit line 316 representing a data bit stored in memory cell 306 and amplify a small voltage swing to a recognizable logic level during a read operation. The column decoder/bit line driver 506 may be configured to be controlled by control logic 512 and to select one or more memory strings 308 through applying a bit line voltage generated from voltage generator 510.

The row decoder/word line driver 508 may be configured to be controlled by control logic 512 and to select/deselect memory block 304 of memory cell array 301 and to select/deselect word line 318 of memory block 304. The row decoder/word line driver 508 may also be configured to drive word line 318 with a word line voltage generated from voltage generator 510. In some implementations, the row decoder/word line driver 508 may also select/deselect and drive the BSG line 315 and the TSG line 313. As described in detail below, the row decoder/word line driver 508 is configured to perform program operations on the memory cells 306 coupled to the selected word line 318. The voltage generator 510 may be configured to be controlled by the control logic 512, and generate word line voltage (e.g., read voltage, program voltage, pass voltage, channel boost voltage, verify voltage, etc.), bit line voltage and source line voltage to be supplied to the memory cell array 301.

The control logic 512 may be coupled to each of other portions of the peripheral circuit described above, and configured to control operations of each of the other portions of the peripheral circuit. The register 514 may be coupled to the control logic 512 and include status register, command register and address register for storing status information, command operation code (OP code) and command address for controlling operations of each of the peripheral circuits. The interface 516 may be coupled to control logic 512 and act as a control buffer to buffer and relay control commands received from a host (not shown) to control logic 512 and to buffer and relay status information received from the control logic 512 to the host. Interface 516 may also be coupled to column decoder/bit line driver 506 via data bus 518 and act as a data I/O interface and data buffer to buffer and relay data to/from memory cell array 301.

Figure 6A:
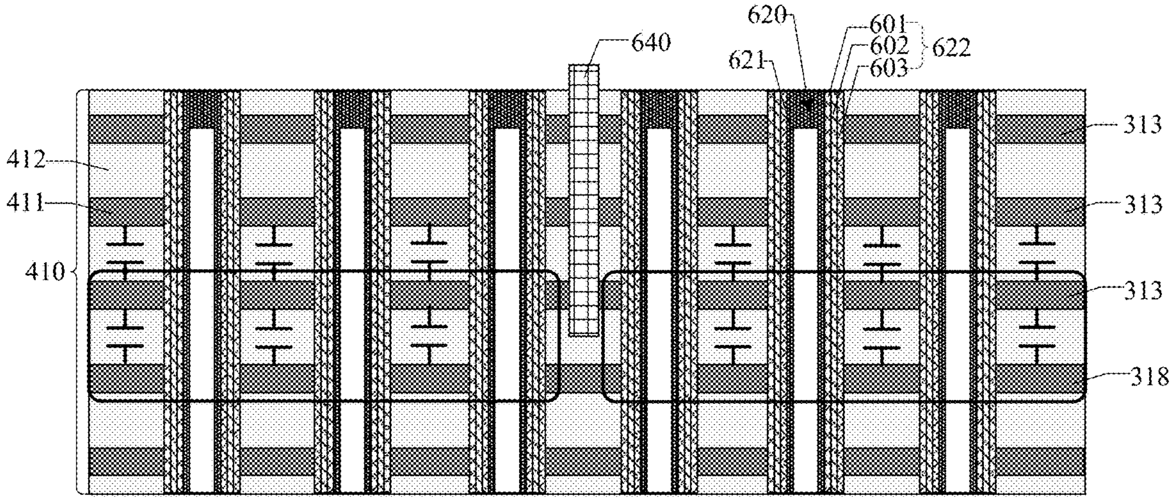
FIG. 6*a* is a structure schematic diagram 1 of a top select line, a word line and a channel structure provided in an embodiment of the present application.

FIG. 6*a* is a structure schematic diagram 1 of a top select line, a word line and a channel structure provided in an embodiment of the present application. In some embodiments, as shown in FIG. 6*a*, the memory cell array includes a stacked structure 410 and a channel structure 620, and the structures of the stacked structure 410 and the channel structure 620 may be understood by referring to the stacked structure 410 and the channel structure described in FIG. 4. Specifically, the stacked structure 410 includes a gate layer 411 and an insulating layer 412 alternately stacked in a vertical direction, and the channel structure 620 is located in the stacked structure and extends in a vertical direction (the direction in which the stacked structure is stacked). The channel structure 620 includes a semiconductor channel 621 and a memory film 622 surrounding the semiconductor channel 621. Exemplarily, the semiconductor channel 621 includes silicon, e.g., polysilicon. Exemplarily, the memory film 622 includes a tunneling layer 601, a storage layer 602, and a blocking layer 603 which are sequentially disposed outward along the center of the channel. Exemplarily, the tunneling layer 601 may include silicon oxide, silicon oxynitride, or any combination thereof. The charge trapping layer 602 silicon nitride, silicon oxynitride, or any combination thereof. The blocking layer 603 may include silicon oxide, silicon oxynitride, a high-k (high-k) dielectric, or any combination thereof. In an example, the memory film 622 may be a composite layer of silicon oxide/silicon oxynitride/silicon oxide (ONO).

The gate layer 411 at the top of the stacked structure 410 is used to form a top select line 313. The number of gate layers used to form the top select line may be one layer or multiple layers. In this embodiment, as shown in FIG. 6*a*, the three gate layers 411 at the top of the stacked structure 410 are all used to form the top select line 313. The memory cell array also includes a top select line isolation structure 640, which vertically extends through the top multiple gate layers 411 of the stacked structure 410, the top select line isolation structure 640 may extend along the stacking direction of the stacked structure to cut each of the multiple gate layers 411 into multiple regions, each region forming a top select line 313. In FIG. 6*a*, the top three gate layers 611 of the stacked structure 410 are divided by the top select line isolation structure 640, so that each memory string is coupled to three top select lines 313.

Figure 6B:
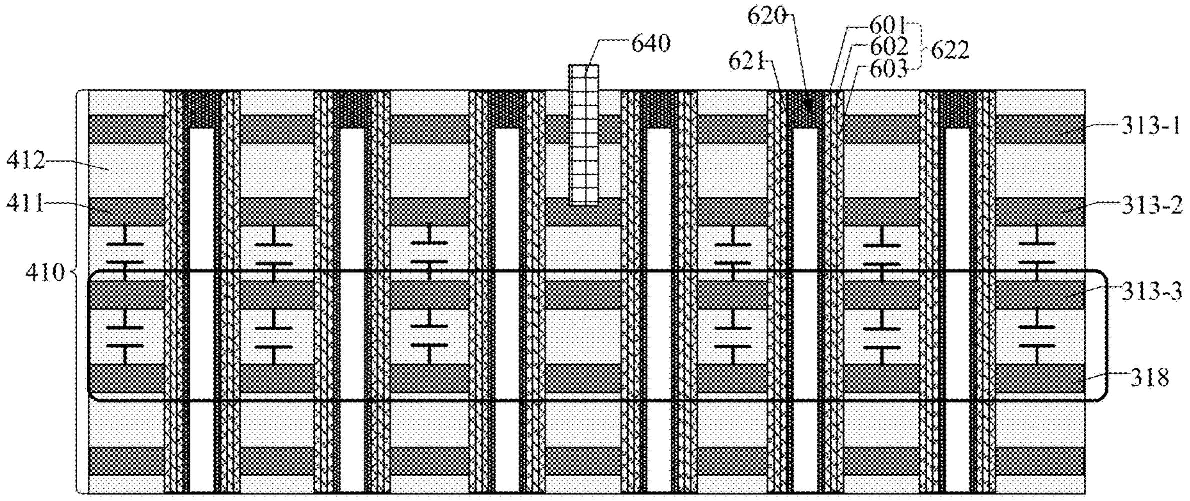
FIG. 6*b* is a structure diagram 2 of a top select line, a word line and a channel structure provided in an embodiment of the present application.

FIG. 6*b* is a structure diagram 2 of a top select line, a word line and a channel structure provided in an embodiment of the present application. As shown in FIG. 6*b*, unlike in FIG. 6*a*, the top select line isolation structure 640 vertically extends through one or more gate layers 411 at the top of the stacked structure 410, e.g., the top select line isolation structure 640 penetrates the topmost gate layer 411 of the stacked structure 410, and partially penetrates a gate layer below the topmost gate layer 411. Based on this, in some embodiments, the multiple top select lines include: a first top select line 313-1 coupled to a coarse control top select gate (Coarse TSG), a second top select line 313-2 coupled to a buffer top select gate (Buffer TSG), and a third top select line 313-3 coupled to a fine control top select gate (Fine TSG). It is to be noted that the number of gate layers used to form the first top select line 313-1 and/or the second top select line 313-2 and/or the third top select line 313-3 may be one or more layers.

It is to be noted that in FIG. 6*b*, the top select line isolation structure 640 penetrates the first gate layer from the top, but does not penetrate the third gate layer from the top, and selectively penetrates the second gate layer from the top. In other words, the top select line isolation structure 640 may not penetrate a gate layer below the topmost gate layer 411, or completely penetrate a gate layer below the topmost gate layer 411.

In the memory cell array shown in FIG. 6*a*, from top to bottom, the areas of the first layer top select line 313, the second layer top select line 313 and the third layer top select line 313 facing the word lines 318 are the areas after the memory block is divided into regions by the top select line isolation structure 640, i.e., the regions circled by each dotted box in FIG. 6*a*; however, in the memory cell array shown in FIG. 6*b*, the area of the first top select line 313-1 facing the word line 318 is the same as that in FIG. 6*a*, but the area of the third top select line 313-3 facing the word line 318 is the area of the entire region, i.e., the region circled by each dotted box in FIG. 6*b*. Compared with FIG. 6*a*, the facing area increases, thus the coupling capacitance between them increases.

Under the structure shown in FIG. 6*b*, the Coarse TSG coupled to the first top select line 313-1, the Buffer TSG coupled to the second top select line 313-2, and the Fine TSG coupled to the third top select line 313-3 have slightly different functional emphases. The main function of the Coarse TSG is to distinguish the memory string in the selected region from the memory string in the unselected region; the main function of the Buffer TSG is to serve as a transition between the Coarse TSG and the Fine TSG, and to protect the Fine TSG from the Hot Carrier Injection effect (HCI). Since Fine TSG turns off an entire region when it is turned off, the main function of Fine TSG is to increase the turn-off function of TSG (generally referring to the entire three layers of TSG). However, the capacitance between the third top select line and the word line increases, and the TSG coupling effect increases, when the Fine TSG coupled to the third top select line is turned on, it may cause a TSG voltage spike, this instantaneous high voltage of TSG may cause leakage in the unselected memory string during program, resulting in a decrease in the self-boosting potential and a larger program interference.

Figure 7:
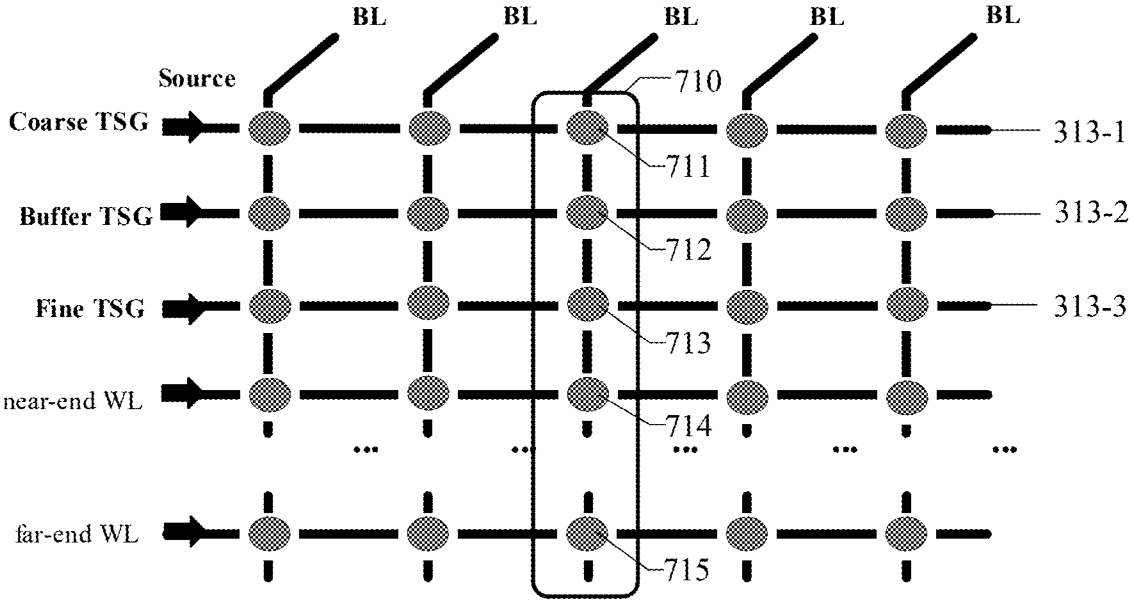
FIG. 7 is a structure schematic diagram of another top select line, top select gate, word line, bit line and memory cell provided in an embodiment of the present application.
Figure 8A:
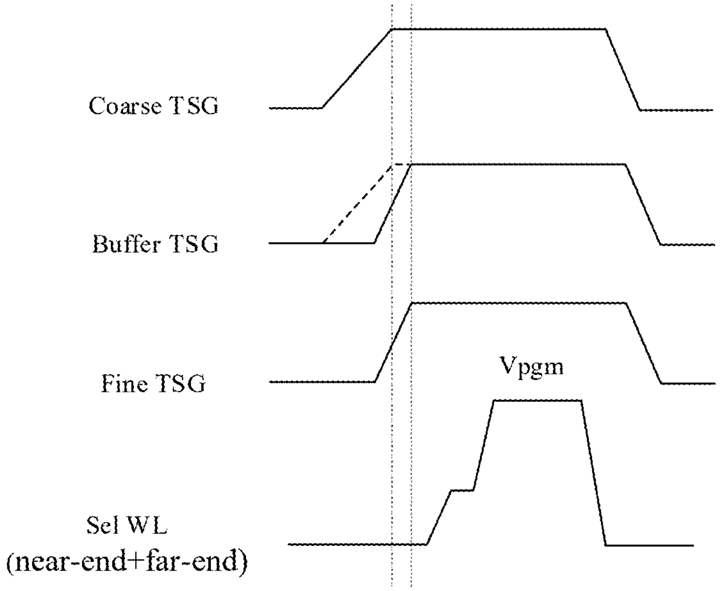
FIG. 8*a* is a schematic diagram 1 of the voltage timing of each top select line and selected word line during the program operation provided in an embodiment of the present application.

FIG. 7 is a structure schematic diagram of another top select line, top select gate, word line, bit line and memory cell provided in an embodiment of the present application; and FIG. 8*a* is a schematic diagram of the voltage timing of each top select line and selected word line during the program operation provided in an embodiment of the present application. The process of program operation is described below in conjunction with FIG. 7 and FIG. 8*a*.

As shown in FIG. 7, the memory cell array includes multiple memory strings 710, the upper end of each memory string 710 is connected to a bit line BL, and each memory string 710 includes multiple top select gates and multiple memory cells. In this embodiment, the multiple top select gates include Coarse TSG 711, Buffer TSG 712 and Fine TSG 713, wherein Coarse TSG 711 is coupled to the coarse control top select line, i.e., the first top select line 313-1, Buffer TSG 712 is coupled to the buffer top select line, i.e., the second top select line 313-2, and Fine TSG 713 is coupled to the fine control top select line, i.e., the third top select line 313-3. The memory cells includes a near-end memory cell 714 closer to Fine TSG 713 and a far-end memory cell 715 farther from Fine TSG 713. The near-end memory cell 714 is coupled to the near-end WL, and the far-end memory cell 715 is coupled to the far-end WL.

In the program operation, the row decoder/WL driver selects a word line according to the row address, and the word line that is selected is referred to as the selected word line (Sel WL); the column decoder/BL driver selects one or more bit lines according to the column address, and the bit lines that are selected are referred to as the selected bit lines. In the program operation, the top select line corresponding to the selected region is applied with a select voltage to turn on the top select gates.

As shown in FIG. 8*a*, during the program process, a first select voltage is applied to the selected first top select line, a second select voltage is applied to the second top select line, and a third select voltage is applied to the third top select line. Here, an instant of time when the first top select line reaches the first select voltage is different from an instant of time when the third top select line reaches the third select voltage, e.g., the instant of time when the first top select line reaches the first select voltage is earlier than the instant of time when the third top select line reaches the third select voltage. For all of the selected word lines, the voltage application approach of the second top select line is the same as the voltage application approach of the first top select line or the same as the voltage application approach of the third top select line, that is, the instant of time when the second top select line reaches the second select voltage is the same as the instant of time when the first top select line reaches the first select voltage (i.e., the rising edge portion of Buffer TSG indicated by the dotted line in FIG. 8*a*) or the same as the instant of time when the third top select line reaches the third select voltage (i.e., the rising edge portion of Buffer TSG indicated by the solid line in FIG. 8*a*). After each of the top select lines corresponding to the selected region reaches its corresponding select voltage, a program voltage (Vpgm) is applied to the selected word line (Sel WL), and a turn-on voltage is applied to the unselected word line (not shown in FIG. 8*a*).

As described above, the increase in capacitance between Fine TSG and the adjacent WL leads to an increase in coupling to Fine TSG, resulting in a voltage spike of Fine TSG, and this instantaneous high voltage of Fine TSG will cause leakage of the unselected string during program, resulting in a decrease in the self-boosting potential. The near-end word line is closer to the third top select line, and the program crosstalk of the memory cells coupled thereto is greatly affected by the shut-off capability of the select gate on the select line, while the far-end word line is farther from the third top select line, and the program crosstalk of the memory cells coupled thereto is greatly affected by the voltage spike coupling of the select gate on the select line. In view of the different points having effect on the program crosstalk of the memory cells coupled to the near-end word line and the far-end word line, if the voltage application approach of the second top select line is the same for all the selected word lines, the program interference of the memory cells coupled to different selected word lines cannot be well suppressed.

In order to better suppress program crosstalk in different situations, an embodiment of the present application provides a memory device, including a first top select line, a second top select line, a third top select line, and multiple word lines stacked in sequence; multiple memory cells coupled to each word line; a peripheral circuit coupled to the first top select line, the second top select line, the third top select line, and the multiple word lines, wherein the peripheral circuit is configured to: in the process of programming multiple memory cells coupled to the selected word line of the multiple word lines, dynamically adjust the application approach of the select voltage on the second top select line according to the different distances between the selected word line and the third top select line; wherein the instant of time when the first top select line reaches its select voltage is different from the instant of time when the third top select line reaches its select voltage; and the instant of time when the second top select line reaches its select voltage is not earlier than the instant of time when the first top select line reaches its select voltage and not later than the instant of time when the third top select line reaches its select voltage.

Here, the memory device may be understood with reference to the description of the aforementioned memory device. The first top select line, i.e., the coarse control top select line, is coupled to the Coarse TSG; the second top select line, i.e., the buffer top select line, is coupled to the Buffer TSG; the third top select line, i.e., the fine control top select line, is coupled to the Fine TSG; wherein the distance between the third top select line and the word line is the shortest; the positional relationship between each top select line and the word line, and the positional relationship between each top select line and the memory cell may be understood by referring to the schematic diagrams and corresponding descriptions in FIG. 6*b* and FIG. 7, and will not be repeated here.

In some embodiments, during the program operation, a program enable voltage is applied to a selected bit line coupled to a selected memory cell, and a program disable voltage is applied to an unselected bit line coupled to an unselected memory cell; then, the select voltage is applied to the first top select line coupled to the Coarse TSG of the selection region, the second top select line coupled to the Buffer TSG, and the third top select line coupled to the Fine TSG of the entire region, respectively, and the bottom select line is floated; then, the program voltage is applied to the selected memory cell coupled to the selected word line, and a turn-on voltage is applied to the unselected word line coupled to the unselected memory cell, so that the program operation of the selected memory cell may be completed. After the program operation is completed, the selected word line and the unselected word line are firstly floated, and then the top select lines are each floated.

As described above, the Coarse TSG coupled to the first top select line, the Buffer TSG coupled to the second top select line, and the Fine TSG coupled to the third top select line have slightly different functional emphases, wherein the instant of time when the first top select line reaches its select voltage is different from the instant of time when the third top select line reaches its select voltage. It is to be understood that the voltage spike is mainly strongest when the top select line reaches its select voltage, that is, the instant of time when it begins to stabilize, and when the stabilization moments of the two are staggered, only one reaches stability at different instant of times, and the other has not started to apply pulses at this instant of time, or has stabilized. Compared with the two reaching stability at the same instant of time, the superposition effect of coupling will be significantly weakened, and the situation of spike discharge may also be alleviated to a certain extent.

In some embodiments, the instant of time when the first top select line reaches its select voltage is earlier than the instant of time when the third top select line reaches its select voltage. In this way, when the first top select line corresponding to the selected region reaches its select voltage first, the third top select line corresponding to the entire region reaches its select voltage later, which may prevent the case where after the third top select line corresponding to the entire region reaching its select voltage later weakly turns on the entire region first, the unselected area affects the selected area.

Considering that the program crosstalk of the memory cells coupled with the selected word lines at different distances from the top select line is affected at different points, e.g., the program crosstalk of the memory cell coupled to the far-end word line is seriously affected by the voltage spike coupling of the select gate on the select line, while the program crosstalk of the memory cell coupled to the near-end word line is affected by the turn-off capability of the select gate on the select line, the peripheral circuit of the memory device dynamically adjusts the application approach of the select voltage on the second top select line according to the different distances between the selected word line and the third top select line during the program operation on the multiple memory cells coupled to the selected word line, so that the second top select line reaches its select voltage no earlier than the first top select line reaches its select voltage and no later than the third top select line reaches its select voltage. In this way, the select voltage application approach on the second top select line may be flexibly set according to the distance between the selected word line and the top select line, so as to better suppress program crosstalk in different situations.

Figure 8B:
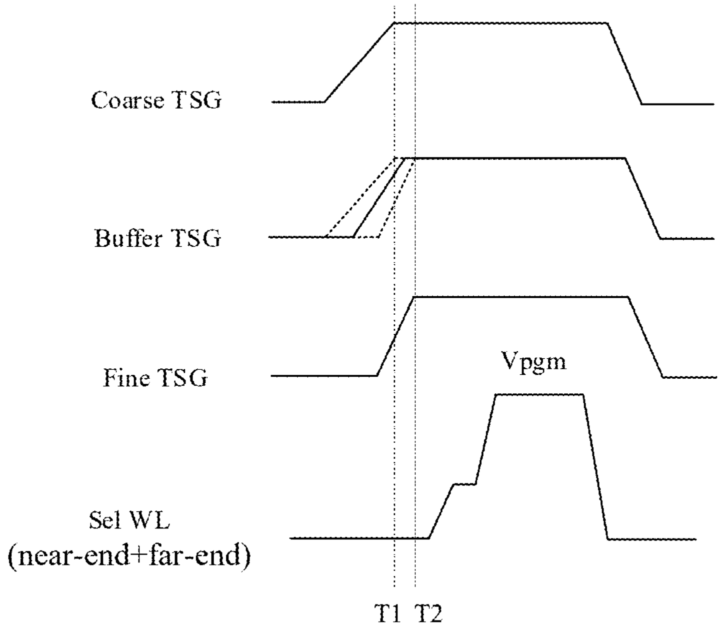
FIG. 8*b* is a schematic diagram 2 of a voltage timing of each top select line and selected word line during the program operation provided in an embodiment of the present application.

Exemplarily, as shown in FIG. 8*b*, the dashed line in FIG. 8*b* respectively illustrates the case that the instant of time when the rising edge of Buffer TSG reaches its select voltage is the same as the instant of time when the rising edge of Coarse TSG reaches its select voltage (T1) and the instant of time when the rising edge of Fine TSG reaches its select voltage (T2); the solid line illustrates the case that the instant of time when the rising edge of Buffer TSG reaches its select voltage is no earlier than T1 and no later than T2, that is, between T1 and T2.

In some embodiments, all word lines may be grouped according to the distance between the word line and the third top select line, and the voltage application approach of the buffer TSG may be finely adjusted according to the group to which the selected word line to be programmed belongs, that is, for the group closest to the Fine TSG, the Buffer TSG and the Fine TSG reach the corresponding select voltage at the same instant of time; for the group farthest from the Fine TSG, the Buffer TSG and the Coarse TSG reach the corresponding select voltage at the same instant of time; for the group in the middle distance, the Buffer TSG reaches the corresponding select voltage no earlier than the Coarse TSG reaches its select voltage and no later than the Fine TSG reaches its select voltage, and the instant of times when the Buffer TSG reaches the corresponding select voltage vary as the distances, specifically, the closer the group is to the Fine TSG, the closer the instant of time when the Buffer TSG and Fine TSG reach the corresponding select voltage, the closer the group is to the Coarse TSG, the closer the instant of time when the Buffer TSG and Coarse TSG reach the corresponding select voltage.

In some embodiments, the peripheral circuit is configured to: based on the distance between the selected word line and the third top select line being less than a first preset distance, control the instant of time when the second top select line reaches its select voltage to be the same as the instant of time when the third top select line reaches its select voltage; based on the distance between the selected word line and the third top select line being greater than a second preset distance, control the instant of time when the second top select line reaches its select voltage to be the same as the instant of time when the first top select line reaches its select voltage; the second preset distance is greater than or equal to the first preset distance.

Here, the first preset distance and the second preset distance may be adjusted according to actual conditions. In some embodiments, all word lines are numbered from the closest to the third top selected word line in ascending order (e.g., the total number of all word lines is n+1, and the word lines from the closest to the third top selected word line are the 0th word line, the 1st word line, the 2nd word line . . . the nth word line); the impact evaluation results of all word lines on the turn-off effect and the coupling effect (voltage spike) are obtained through experiments; and the first preset distance and the second preset distance are determined based on the impact evaluation results.

Exemplarily, the program crosstalk of the memory cell coupled to the 0th word line is most affected by the turn-off effect, starting from the 0th word line, the program crosstalk of the memory cells coupled to the word lines with larger numbers begins to be less affected by the turn-off effect, and at the same instant of time, the influence of the coupling effect begins to increase, until the memory cells coupled to the mth word line, the difference between the turn-off effect and the coupling effect on program crosstalk is not obvious, the difference between the turn-off effect and the coupling effect on program crosstalk from the memory cell coupled to the mth word line to the memory cell coupled to the pth word line is not obvious, after the pth word line, the program crosstalk is significantly more affected by the coupling effect than by the turn-off effect, starting from the pth word line, the memory cell program crosstalk coupled to the word line with a larger number begins to be increasingly affected by the coupling effect, while being less affected by the turn-off effect, at this point, the distance between the mth word line or the word line near it and the third top select line may be used as the first preset distance, and the distance between the pth word line or the word line near it and the third top select line may be used as the second preset distance. In this way, the first preset distance and the second preset distance may be determined. Here, n, p, and m are all positive integers, and $p<m<n+1$.

In the embodiment of the present application, the distance between the selected word line and the third top select line is less than the first preset distance, which indicates that the selected word line is the aforementioned near-end word line, and the near-end word line is greatly affected by the turn-off effect, at this instant of time, the instant of time when the second top select line reaches its select voltage is controlled to be the same as the instant of time when the third top select line reaches its select voltage, that is, the Buffer TSG follows the Fine TSG, which is equivalent to adding an extra layer of Fine TSG, thereby enhancing the turn-off effect of the Fine TSG, which in turn improves the program crosstalk of the memory cell coupled to the near-end selected word line.

In the embodiment of the present application, the distance between the selected word line and the third top select line is greater than the second preset distance, which indicates that the selected word line is the aforementioned far-end word line, and the far-end word line is mainly affected by the coupling effect, at this instant of time, the instant of time when the second top select line reaches its select voltage is controlled to be the same as the instant of time when the first top select line reaches its select voltage, that is, Buffer TSG follows Coarse TSG, allowing Buffer TSG to reach its select voltage in advance, and when Fine TSG receives the pulse of the select voltage, Buffer TSG is already in a relatively stable state, and the coupling effect on Fine TSG will be significantly weakened, thereby improving the discharge caused by coupling, which may in turn improve the program crosstalk of the memory cell coupled to the far-end selected word line.

If the first preset distance is greater than the second preset distance, there may be a case where the distance between the selected word line and the third top select line is greater than or equal to the first preset distance and less than or equal to the second preset distance.

In some embodiments, the peripheral circuit is configured to: based on the distance between the selected word line and the third top select line being greater than or equal to the first preset distance and less than or equal to the second preset distance, control the instant of time when the second top select line reaches its select voltage to be the same as the instant of time when the first top select line reaches its select voltage.

Here, when the distance between the selected word line and the third top select line is greater than or equal to the first preset distance and less than or equal to the second preset distance, the instant of time when the second top select line reaches its select voltage may be controlled to be the same as the instant of time when the first top select line reaches its select voltage, and the magnitude of the select voltage applied to the second top select line is controlled to be the same as the magnitude of the select voltage applied to the first top select line. In other words, in some embodiments, when the selected word line does not belong to the near-end word line, the processing may be performed by applying a voltage through the second top select line corresponding to the far-end word line.

In some embodiments, the memory device further includes a top select line isolation structure; the top select line isolation structure penetrates the first top select line and partially penetrates the second top select line; the deeper the depth of the top select line isolation structure penetrating the second top select line, the larger the value of the corresponding second preset distance.

Here, the top select line isolation structure penetrates the first top select line, partially penetrates the second top select line, but does not penetrate the third top select line, and the top select isolation structure may be understood by referring to the schematic diagram and corresponding description in FIG. 6*b*, which will not be repeated here. It may be understood that the depth of the top select line isolation structure penetrating the second top select line is different, and the strength of the coupling effect is also different, thus the magnitude of the second preset distance related to the coupling effect is also different.

More specifically: the larger the penetration depth of the second top select line, the closer the function of the second top select line is to the function of the first top select line, at this point, the smaller the coupling capacitance is, the smaller the coupling effect is, and the coupling effect will be more obvious on the farther word lines, the value of the aforementioned p is relatively large, and thus the corresponding value of the second preset distance is relatively large; while the smaller the penetration depth of the second top select line, the closer the function of the second top select line is to the function of the third top select line, at this point, the larger the coupling capacitance is, the larger the coupling effect is, and the coupling effect is obvious even for word lines that are not very far away, the value of the aforementioned p is relatively small, and thus the corresponding value of the second preset distance is relatively small.

In some embodiments, the peripheral circuit is configured to: based on the distance between the selected word line and the third top select line being less than the first preset distance, the voltage magnitude of the select voltage applied to the second top select line is the same as the voltage magnitude of the select voltage applied to the third top select line; based on the distance between the selected word line and the third top select line being greater than the second preset distance, the voltage magnitude of the select voltage applied to the second top select line is the same as the voltage magnitude of the select voltage applied to the first top select line.

Here, the voltage magnitude of the select voltage may be understood as the stable voltage value of the pulse corresponding to the select voltage. The voltage magnitude of the select voltage applied to the first top select line and the voltage magnitude of the select voltage applied to the third top select line may be the same or different. In the embodiment of the present application, regardless of whether the voltage magnitude of the select voltage applied to the first top select line is the same as the voltage magnitude of the select voltage applied to the third top select line, when the distance between the selected word line and the third top select line is less than the first preset distance, the voltage magnitude of the select voltage applied to the second top select line is the same as the voltage magnitude of the select voltage applied to the third top select line; when the distance between the selected word line and the third top select line is greater than the second preset distance, the voltage magnitude of the select voltage applied to the second top select line is the same as the voltage magnitude of the select voltage applied to the first top select line.

In some embodiments, the voltage magnitude of the select voltage applied to the first top select line is different from the voltage magnitude of the select voltage applied to the third top select line.

As described above, the main function of Coarse TSG is to distinguish the memory string of the selected region from the memory string of the unselected region, based on this, the voltage magnitude of the select voltage of the first top select line coupled to Coarse TSG is greater than the select voltage of the third top select line coupled to Fine TSG. For example, the voltage magnitude of the select voltage of the first top select line is 5V, and the voltage magnitude of the select voltage of the third top select line is 3V.

When the voltage magnitude of the select voltage applied to the first top select line is different from the voltage magnitude of the select voltage applied to the third top select line, they need to be powered by different voltage sources. In some embodiments, the peripheral circuit includes a first voltage generation circuit and a second voltage generation circuit; the first voltage generation circuit is configured to provide a select voltage for the first top select line; the second voltage generation circuit is configured to provide a select voltage for the third top select line; the peripheral circuit is configured to: based on the distance between the selected word line and the third top select line being less than the first preset distance, supply power to the second top select line by using the second voltage generation circuit; based on the distance between the selected word line and the third top select line being greater than the first preset distance, supply power to the second top select line by using the first voltage generation circuit.

Thus, in the embodiment of the present application, although the application approach of the select voltage on the second top select line is dynamically adjusted according to the different distances between the selected word line and the third top select line, the select voltage on the second top select line will share the voltage generation circuit corresponding to the first top select line or the voltage generation circuit corresponding to the third top select line, therefore, dynamic adjustment of the select voltage on the second top select line is achieved without adding a new hardware circuit, which in turn suppresses program crosstalk in different situations and avoids the increase in cost caused by adding hardware circuits.

Figure 9A:
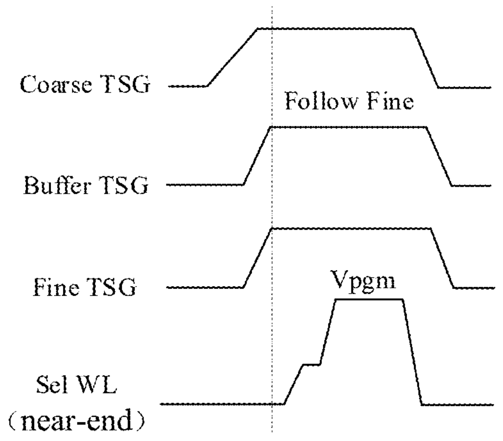
FIG. 9*a* is a schematic diagram 1 of another voltage timing of each top select line and selected word line during the program operation provided in an embodiment of the present application.
Figure 9B:
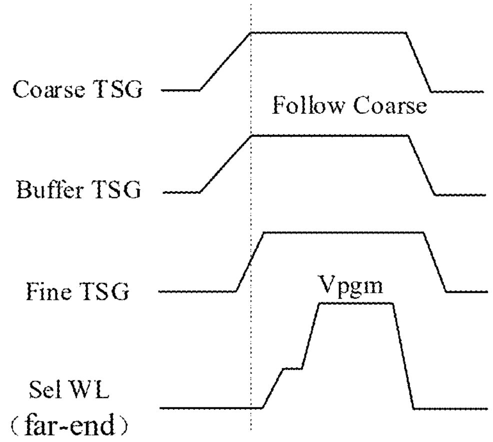
FIG. 9*b* is a schematic diagram 2 of another voltage timing of each top select line and selected word line during the program operation provided in an embodiment of the present application.
Figure 10A:
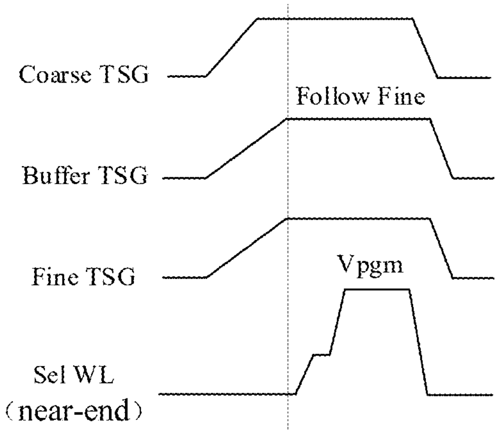
FIG. 10*a* is a schematic diagram 1 of still another voltage timing of each top select line and selected word line during the program operation provided in an embodiment of the present application.
Figure 10B:
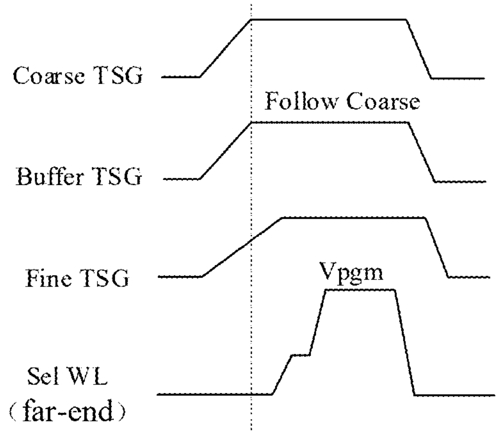
FIG. 10*b* is a schematic diagram 1 of still another voltage timing of each top select line and selected word line during the program operation provided in an embodiment of the present application.
Figure 11A:
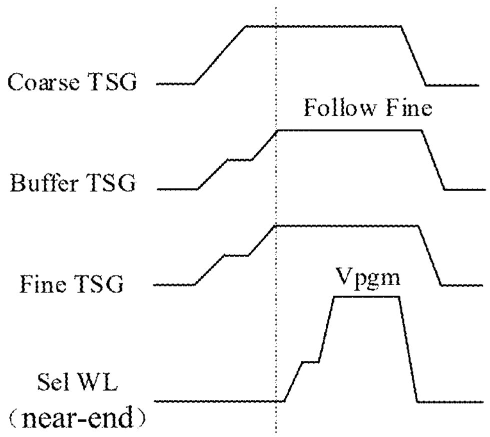
FIG. 11*a* is a schematic diagram 1 of yet another voltage timing of each top select line and selected word line during the program operation provided in an embodiment of the present application.
Figure 11B:
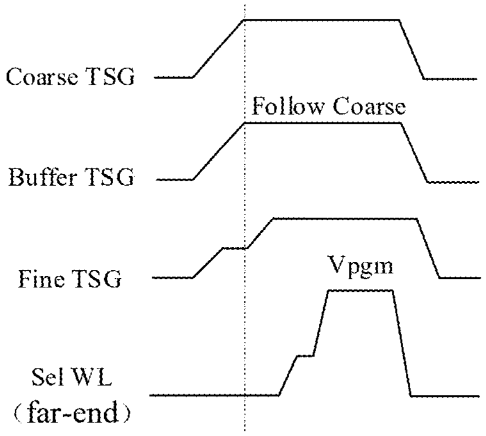
FIG. 11*b* is a schematic diagram 2 of yet another voltage timing of each top select line and selected word line during the program operation provided in an embodiment of the present application.

In embodiments of the present application, multiple different voltage application approaches may be employed to make the instant of time when the first top select line reaches its select voltage to be different from the instant of time when the third top select line reaches its select voltage. Several exemplary implementations are presented in the following. FIG. 9*a* is a schematic diagram 1 of another voltage timing of each top select line and selected word line during the program operation provided in an embodiment of the present application; FIG. 9*b* is a schematic diagram 2 of another voltage timing of each top select line and selected word line during the program operation provided in an embodiment of the present application; FIG. 10*a* is a schematic diagram 1 of still another voltage timing of each top select line and selected word line during the program operation provided in an embodiment of the present application; FIG. 10*b* is a schematic diagram 2 of still another voltage timing of each top select line and selected word line during the program operation provided in an embodiment of the present application; FIG. 11*a* is a schematic diagram 1 of yet another voltage timing of each top select line and selected word line during the program operation provided in an embodiment of the present application; FIG. 11*b* is a schematic diagram 2 of yet another voltage timing of each top select line and selected word line during the program operation provided in an embodiment of the present application. The following describes, in conjunction with FIGS. 9*a* to 11*b*, in detail how to employ different voltage application approaches to make the first top select line, the second top select line and the third top select line meet the instant of time requirements of reaching the corresponding select voltage.

In some embodiments, the peripheral circuit is configured to: based on the distance between the selected word line and the third top select line being less than the first preset distance, the start instant of time of the select voltage applied to the second top select line is later than the start instant of time of the select voltage applied to the first top select line; based on the distance between the selected word line and the third top select line being greater than the second preset distance, the start instant of time of the select voltage applied to the second top select line is earlier than the start instant of time of the select voltage applied to the third top select line.

Exemplarily, as shown in FIGS. 9*a* and 9*b*, the start instant of time of the select voltage applied to the third top select line is later than the start instant of time of the select voltage applied to the first top select line, and the instant of time when the third top select line reaches its select voltage is later than the instant of time when the first top select line reaches its select voltage. As shown in FIG. 9*a*, based on the distance between the selected word line and the third top select line being less than the first preset distance, the start instant of time of the select voltage applied to the second top select line is later than the start instant of time of the select voltage applied to the first top select line, e.g., the select voltage applied to the Buffer TSG follows the Fine TSG. As shown in FIG. 9*b*, based on the distance between the selected word line and the third top select line being greater than the second preset distance, the start instant of time of the select voltage applied to the second top select line is earlier than the start instant of time of the select voltage applied to the third top select line, e.g., the select voltage applied to the Buffer TSG follows the Coarse TSG.

In some embodiments, the peripheral circuit is configured to implement at least one of the following: when applying the select voltage to the first top select line and the third top select line, the start instant of times for the select voltage applied to the first top select line and the third top select line are different; controlling the lifting rates of the first top select line and the third top select line to reach the corresponding select voltage to be different; controlling the number of lifting times of the first top select line and the third top select line to reach the corresponding select voltage to be different.

Here, only the case that the instant of time when the first top select line reaches its select voltage is earlier than the instant of time when the third top select line reaches its select voltage is taken as an example for explanation.

In some embodiments, the peripheral circuit is configured to implement at least one of the following: when applying the select voltage to the first top select line and the third top select line, the start instant of time for the select voltage applied to the first top select line is earlier than the start instant of time for the select voltage applied to the third top select line; controlling the lifting rates of the first top select line to reach its select voltage to be greater than the lifting rate of the third top select line to reach its select voltage; controlling the number of lifting times of the first top select line to reach its select voltage to be less than the number of lifting times of the third top select line to reach its select voltage.

Exemplarily, as shown in FIGS. 9*a* and 9*b*, the instant of time when the first top select line reaches its select voltage is earlier than the instant of time when the third top select line reaches its select voltage, and the start instant of time of the select voltage applied to the third top select line is later than the start instant of time of the select voltage applied to the first top select line. As shown in FIG. 9*a*, based on the distance between the selected word line and the third top select line being less than the first preset distance, the start instant of time of the select voltage applied to the second top select line is later than the start instant of time of the select voltage applied to the first top select line, e.g., the select voltage applied to the Buffer TSG follows the Fine TSG. As shown in FIG. 9*b*, based on the distance between the selected word line and the third top select line being greater than the second preset distance, the start instant of time of the select voltage applied to the second top select line is earlier than the start instant of time of the select voltage applied to the third top select line, e.g., the select voltage applied to the Buffer TSG follows the Coarse TSG.

Exemplarily, as shown in FIGS. 10*a* and 10*b*, the lifting rate of the first top select line to reach its select voltage is greater than the lifting rate of the third top select line to reach its select voltage. As shown in FIG. 10*a*, based on the distance between the selected word line and the third top select line being less than the first preset distance, the lifting rate of the second top select line to reach its select voltage is controlled to be less than the lifting rate of the first top select line to reach its select voltage, e.g., the select voltage applied to the Buffer TSG follows the Fine TSG. As shown in FIG. 10*b*, based on the distance between the selected word line and the third top select line being greater than the second preset distance, the lifting rate of the second top select line to reach its select voltage is controlled to be greater than the lifting rate of the third top select line to reach its select voltage, e.g., the select voltage applied to the Buffer TSG follows the Coarse TSG.

Exemplarily, as shown in FIGS. 11*a* and 11*b*, the number of lifting times of the first top select line to reach its select voltage is less than the number of lifting times of the third top select line to reach its select voltage, it is to be noted that the fewer the number of lifting times, the shorter the waiting plateau period, and thus the sooner its stable voltage may be reached. As shown in FIG. 11*a*, based on the distance between the selected word line and the third top select line being less than the first preset distance, the number of lifting times (e.g., 2 instant of times) of the second top select line to reach its select voltage is controlled to be greater than the number of lifting times (e.g., 1 instant of time) of the first top select line to reach its select voltage, e.g., the select voltage applied to the Buffer TSG follows the Fine TSG. As shown in FIG. 11*b*, based on the distance between the selected word line and the third top select line being greater than the second preset distance, the number of lifting times (e.g., 1 instant of time) of the second top select line to reach its select voltage is controlled to be less than the number of lifting times (e.g., 2 instant of times) of the third top select line to reach its select voltage, e.g., the select voltage applied to the Buffer TSG follows the Coarse TSG.

It is to be noted that the various examples described above may be combined with each other without conflict.

An embodiment of the present application provides a memory device, including a first top select line, a second top select line, a third top select line, and multiple word lines stacked in sequence; multiple memory cells coupled to each word line; a peripheral circuit coupled to the first top select line, the second top select line, the third top select line, and the multiple word lines, wherein the peripheral circuit is configured to: in the first program stage, apply a first program voltage to a first word line; in the first program stage, apply a first select voltage to the first top select line, apply a second select voltage to the second top select line, and apply a third select voltage to the third top select line; in the second program stage, apply a second program voltage to a second word line; in the second program stage, apply the first select voltage to the first top select line, apply a fourth select voltage to the second top select line, and apply the third select voltage to the third top select line; wherein in the first program stage, the instant of time when the second top select line reaches the second select voltage is different from the instant of time when the first top select line reaches the first select voltage, and in the second program stage, the instant of time when the second top select line reaches the fourth select voltage is different from the instant of time when the third top select line reaches the third select voltage.

Here, the memory device may be understood with reference to the description of the aforementioned memory device. The first top select line, i.e., the coarse control top select line, is coupled to the Coarse TSG; the second top select line, i.e., the buffer top select line, is coupled to the Buffer TSG; the third top select line, i.e., the fine control top select line, is coupled to the Fine TSG; wherein the distance between the third top select line and the word line is the shortest; the positional relationship between each top select line and the word line, and the positional relationship between each top select line and the memory cell may be understood by referring to the schematic diagrams and corresponding descriptions in FIG. 6*b* and FIG. 7, and will not be repeated here.

Here, the first program stage and the second program stage are respectively corresponding to different selected word lines, that is, the first program stage performs program operation on the first word line, and the second program stage performs program operation on the second word line. In different program stages of the memory device, the ways to apply select voltages on the first top select line and the third top select line may be the same; at the same instant of time, in different program stages of the memory device, the ways to apply select voltages on the second top select line may be different. Specifically, in the first program stage, the instant of time when the second top select line reaches the second select voltage is different from the instant of time when the first top select line reaches the first select voltage, and in the second program stage, the instant of time when the second top select line reaches the fourth select voltage is different from the instant of time when the third top select line reaches the third select voltage.

In some embodiments, the distance between the first word line and the third top select line is less than the distance between the second word line and the third top select line; in the first program stage, the instant of time when the second top select line reaches the second select voltage is later than the instant of time when the first top select line reaches the first select voltage; in the second program stage, the instant of time when the second top select line reaches the fourth select voltage is earlier than the instant of time when the third top select line reaches the third select voltage.

Here, the first word line is closer to the third selection line than the second word line is. In the first program stage, the instant of time when the second top select line reaches the second select voltage is later than the instant of time when the first top select line reaches the first select voltage, and the instant of time when the first top select line reaches the first select voltage is earlier than the instant of time when the third top select line reaches the third select voltage; in the second program stage, the instant of time when the second top select line reaches the fourth select voltage is earlier than the instant of time when the third top select line reaches the third select voltage, and the instant of time when the first top select line reaches the first select voltage is earlier than the instant of time when the third top select line reaches the third select voltage.

In some embodiments, a voltage magnitude of the second select voltage is the same as or different from the voltage magnitude of the fourth select voltage.

Here, exemplarily, the voltage magnitude of the second select voltage and the voltage magnitude of the fourth select voltage may be 5V or 3V. In some embodiments, the first word line is closer to the third selection line than the second word line is, and the voltage of the second select voltage is greater than the voltage of the fourth select voltage. The voltage magnitude of the second select voltage may be 5V, and the voltage magnitude of the fourth select voltage may be 3V.

In some embodiments, the distance between the first word line and the third top select line being less than a first preset distance, in the first program stage, the instant of time when the second top select line reaches the second select voltage is the same as the instant of time when the third top select line reaches the third select voltage; the distance between the second word line and the third top select line being greater than a second preset distance, the instant of time when the second top select line reaches the fourth select voltage is the same as the instant of time when the first top select line reaches the first select voltage.

Here, the first preset distance and the second preset distance may be understood with reference to the aforementioned first preset distance and second preset distance, the first word line may be understood as the aforementioned near-end word line, and the second word line may be understood as the far-end word line.

In some embodiments, the voltage magnitude of the second select voltage is the same as the voltage magnitude of the third select voltage; the voltage magnitude of the fourth select voltage is the same as the voltage magnitude of the first select voltage.

Here, that is, based on the distance between the first word line and the third top select line being less than the first preset distance, it is indicated that the first word line is a near-end word line, and the near-end word line is greatly affected by the turn-off effect, at this point, Buffer TSG is controlled to follow Fine TSG; based on the distance between the second word line and the third top select line being greater than the second preset distance, it is indicated that the second word line is the aforementioned far-end word line, and the far-end word line is mainly affected by the coupling effect, at this point, Buffer TSG is controlled to follow Coarse TSG.

In some embodiments, the peripheral circuit is configured to implement at least one of the following: control, in the first program stage, the instant of time to start to apply the second select voltage to be later than the instant of time to start to apply the first select voltage, and in the second program stage, the instant of time to start to apply the fourth select voltage to be earlier than the instant of time to start to apply the third select voltage; control the lifting rate of the second top select line to reach the second select voltage in the first program stage to be greater than the lifting rate to reach the fourth select voltage in the second program stage; control the number of lifting times of the second top select line to reach the second select voltage in the first program stage to be less than the number of lifting times to reach the fourth select voltage in the second program stage.

Here, this may be understood by referring to the aforementioned FIGS. 9*a* to 11*a*.

An embodiment of the present application further provides a memory system, the memory system includes: one or more memory devices as provided by one or more embodiments of the present application; and a memory controller coupled to and controlling the memory device.

Here, the memory controller may be understood by referring to the description of the memory system in FIG. 1. In some embodiments, the memory system may be a solid state drive, and the memory device may be a NAND memory.

An embodiment of the present application further provides an operating method for a memory device, wherein the memory device includes a first top select line, a second top select line, a third top select line, and multiple word lines stacked in sequence; the operating method includes: in the process of programming multiple memory cells coupled to the selected word line of the multiple word lines, dynamically adjusting the application approach of the select voltage on the second top select line according to the different distances between the selected word line and the third top select line; wherein the instant of time when the first top select line reaches its select voltage is different from the instant of time when the third top select line reaches its select voltage; the instant of time when the second top select line reaches its select voltage is not earlier than the instant of time when the first top select line reaches its select voltage and not later than the instant of time when the third top select line reaches its select voltage.

In some embodiments, the dynamically adjusting the application approach of the select voltage on the second top select line according to the different distances between the selected word line and the third top select line includes: based on the distance between the selected word line and the third top select line being less than a first preset distance, controlling the instant of time when the second top select line reaches its select voltage to be the same as the instant of time when the third top select line reaches its select voltage; based on the distance between the selected word line and the third top select line being greater than a second preset distance, controlling the instant of time when the second top select line reaches its select voltage to be the same as the instant of time when the first top select line reaches its select voltage; the second preset distance is greater than or equal to the first preset distance.

In some embodiments, the top select line isolation structure penetrates the first top select line and partially penetrates the second top select line; the deeper the depth of the top select line isolation structure penetrating the second top select line, the larger the value of the corresponding second preset distance.

In some embodiments, the method further includes: based on the distance between the selected word line and the third top select line being less than the first preset distance, the voltage magnitude of the select voltage applied to the second top select line is the same as the voltage magnitude of the select voltage applied to the third top select line; based on the distance between the selected word line and the third top select line being greater than the second preset distance, the voltage magnitude of the select voltage applied to the second top select line is the same as the voltage magnitude of the select voltage applied to the first top select line.

In some embodiments, the voltage magnitude of the select voltage applied to the first top select line is different from the voltage magnitude of the select voltage applied to the third top select line.

In some embodiments, the method further includes: based on the distance between the selected word line and the third top select line being greater than or equal to the first preset distance and less than or equal to the second preset distance, controlling the instant of time when the second top select line reaches its select voltage to be the same as the instant of time when the first top select line reaches its select voltage.

In some embodiments, the method further includes: based on the distance between the selected word line and the third top select line being less than the first preset distance, the start instant of time of the select voltage applied to the second top select line is later than the start instant of time of the select voltage applied to the first top select line; based on the distance between the selected word line and the third top select line being greater than the second preset distance, the start instant of time of the select voltage applied to the second top select line is earlier than the start instant of time of the select voltage applied to the third top select line.

In some embodiments, the method further includes at least one of the following: when applying the select voltage to the first top select line and the third top select line, the start instant of times of the select voltage applied to the first top select line and the third top select line are different; controlling the lifting rates of the first top select line and the third top select line to reach the corresponding select voltage to be different; controlling the number of lifting times of the first top select line and the third top select line to reach the corresponding select voltage to be different.

Here, the implementation of the embodiment of the operating method for a memory device may be understood by referring to the implementation of the embodiment in the aforementioned memory device.

It is to be understood that reference throughout the description to "one embodiment" or "an embodiment" means that a particular feature, structure or characteristic related to the embodiment is included in at least one embodiment of the present application. Thus, appearances of "in one embodiment" or "in an embodiment" in various places throughout the description are not necessarily referring to a same embodiment. Furthermore, these particular features, structures or characteristics may be combined in any appropriate manner in one or more embodiments. It is to be understood that in various embodiments of the present application, sequence numbers of the processes described above do not mean the execution order, and the execution order of each process is to be determined by its function and internal logic, and should not constitute any limitation to implementation process of embodiments of the present application. The serial numbers of embodiments of the present application described above are for the purpose of description only, and do not represent the advantages and disadvantages of the embodiments.

The methods disclosed in several method embodiments provided in the present application may be combined arbitrarily without conflicts to obtain new method embodiments.

The above is only implementations of the present application, but the claimed scope of the present application is not limited thereto, and changes or substitutions within the technical scope disclosed in the present application that may be easily conceived by those skilled in the art shall fall within the claimed scope of the present application. Therefore, the claimed scope of the present application is to be determined by the claimed scope of the claims.

What is claimed is:

1. A memory device, comprising:

a first top select line, a second top select line, a third top select line, and multiple word lines stacked in sequence;

multiple memory cells coupled to each word line; and a peripheral circuit coupled to the first top select line, the second top select line, the third top select line, and the multiple word lines, wherein the peripheral circuit is configured to:

in a process of programming the multiple memory cells coupled to a selected word line of the multiple word lines, dynamically adjust an application approach of a select voltage on the second top select line depending on a distance between the selected word line and the third top select line;

wherein an instant of time when the first top select line reaches its select voltage is different from an instant of time when the third top select line reaches its select voltage, and an instant of time when the second top select line reaches its select voltage is not earlier than the instant of time when the first top select line reaches its select voltage and not later than the instant of time when the third top select line reaches its select voltage.

2. The memory device of claim 1, wherein the peripheral circuit is configured to:

based on the distance between the selected word line and the third top select line being less than a first preset distance, control the instant of time when the second top select line reaches its select voltage to be the same as the instant of time when the third top select line reaches its select voltage; and based on the distance between the selected word line and the third top select line being greater than a second preset distance, control the instant of time when the second top select line reaches its select voltage to be the same as the instant of time when the first top select line reaches its select voltage, wherein the second preset distance is greater than or equal to the first preset distance.

3. The memory device of claim 2, further comprising a top select line isolation structure, wherein the top select line isolation structure penetrates the first top select line and partially penetrates the second top select line, and the deeper a depth of the top select line isolation structure penetrating the second top select line, the larger a value of the corresponding second preset distance.

4. The memory device of claim 2, wherein the peripheral circuit is configured such that:

based on the distance between the selected word line and the third top select line being less than the first preset distance, a voltage magnitude of the select voltage applied to the second top select line is the same as a voltage magnitude of the select voltage applied to the third top select line; and based on the distance between the selected word line and the third top select line being greater than the second preset distance, the voltage magnitude of the select voltage applied to the second top select line is the same as a voltage magnitude of the select voltage applied to the first top select line.

5. The memory device of claim 4, wherein the voltage magnitude of the select voltage applied to the first top select line is different from the voltage magnitude of the select voltage applied to the third top select line.

6. The memory device of claim 5, wherein the peripheral circuit comprises:

a first voltage generation circuit configured to provide a select voltage for the first top select line; and a second voltage generation circuit configured to provide a select voltage for the third top select line;

the peripheral circuit is configured to:

based on the distance between the selected word line and the third top select line being less than the first preset distance, supply power to the second top select line by using the second voltage generation circuit; and based on the distance between the selected word line and the third top select line being greater than the second preset distance, supply power to the second top select line by using the first voltage generation circuit.

7. The memory device of claim 2, wherein the peripheral circuit is configured to:

based on the distance between the selected word line and the third top select line being greater than or equal to the first preset distance and less than or equal to the second preset distance, control the instant of time when the second top select line reaches its select voltage to be the same as the instant of time when the first top select line reaches its select voltage.

8. The memory device of claim 2, wherein the peripheral circuit is configured such that:

based on the distance between the selected word line and the third top select line being less than the first preset distance, a start instant of time for the select voltage applied to the second top select line is later than a start instant of time for the select voltage applied to the first top select line; and based on the distance between the selected word line and the third top select line being greater than the second preset distance, the start instant of time for the select voltage applied to the second top select line is earlier than a start instant of time for the select voltage applied to the third top select line.

9. The memory device of claim 1, wherein the peripheral circuit is configured to implement at least one of the following:

when applying select voltages to the first top select line and the third top select line, a start instant of time for the select voltage applied to the first top select line is different from a start instant of time for the select voltage applied to the third top select line;

controlling a lifting rate for the first top select line to reach its select voltage to be different from a lifting rate for the third top select line to reach its select voltage; or controlling ae number of lifting times for the first top select line to reach its select voltage to be different from a number of lifting times for the third top select line to reach its select voltage.

10. The memory device of claim 9, wherein the peripheral circuit is configured to implement at least one of the following:

when applying select voltages to the first top select line and the third top select line, the start instant of time for the select voltage applied to the first top select line is earlier than the start instant of time for the select voltage applied to the third top select line;

controlling the lifting rate for the first top select line to reach its select voltage to be greater than the lifting rate for the third top select line to reach its select voltage; or controlling the number of lifting times for the first top select line to reach its select voltage to be less than the number of lifting times for the third top select line to reach its select voltage.

11. A memory device, comprising:

a first top select line, a second top select line, a third top select line, and multiple word lines stacked in sequence;

multiple memory cells coupled to each word line; and a peripheral circuit coupled to the first top select line, the second top select line, the third top select line, and the multiple word lines, wherein the peripheral circuit is configured to:

in a first program stage, apply a first program voltage to a first word line;

in the first program stage, apply a first select voltage to the first top select line, apply a second select voltage to the second top select line, and apply a third select voltage to the third top select line;

in a second program stage, apply a second program voltage to a second word line; and in the second program stage, apply the first select voltage to the first top select line, apply a fourth select voltage to the second top select line, and apply the third select voltage to the third top select line;

wherein in the first program stage, an instant of time when the second top select line reaches the second select voltage is different from an instant of time when the first top select line reaches the first select voltage, and in the second program stage, an instant of time when the second top select line reaches the fourth select voltage is different from an instant of time when the third top select line reaches the third select voltage.

12. The memory device of claim 11, wherein a distance between the first word line and the third top select line is less than a distance between the second word line and the third top select line;

in the first program stage, the instant of time when the second top select line reaches the second select voltage is later than the instant of time when the first top select line reaches the first select voltage; and in the second program stage, the instant of time when the second top select line reaches the fourth select voltage is earlier than the instant of time when the third top select line reaches the third select voltage.

13. The memory device of claim 11, wherein a voltage magnitude of the second select voltage is the same as or different from a voltage magnitude of the fourth select voltage.

14. The memory device of claim 11, wherein a distance between the first word line and the third top select line is less than a first preset distance, and in the first program stage, the instant of time when the second top select line reaches the second select voltage is the same as the instant of time when the third top select line reaches the third select voltage; and a distance between the second word line and the third top select line is greater than a second preset distance, and the instant of time when the second top select line reaches the fourth select voltage is the same as the instant of time when the first top select line reaches the first select voltage.

15. The memory device of claim 14, wherein a voltage magnitude of the second select voltage is the same as a voltage magnitude of the third select voltage, and a voltage magnitude of the fourth select voltage is the same as a voltage magnitude of the first select voltage.

16. The memory device of claim 12, wherein the peripheral circuit is configured to implement at least one of the following:

controlling, in the first program stage, an instant of time to start to apply the second select voltage to be later than an instant of time to start to apply the first select voltage, and in the second program stage, an instant of time to start to apply the fourth select voltage to be earlier than an instant of time to start to apply the third select voltage;

controlling a lifting rate for the second top select line to reach the second select voltage in the first program stage to be greater than a lifting rate for the second top select line to reach the fourth select voltage in the second program stage; or controlling the number of lifting times for the second top select line to reach the second select voltage in the first program stage to be less than the number of lifting times for the second top select line to reach the fourth select voltage in the second program stage.

17. An operating method of a memory device, the memory device comprising a first top select line, a second top select line, a third top select line, and multiple word lines stacked in sequence, and the operating method comprising:

in a process of programming multiple memory cells coupled to a selected word line of the multiple word lines, dynamically adjusting an application approach of a select voltage on the second top select line depending on a distance between the selected word line and the third top select line;

wherein an instant of time when the first top select line reaches its select voltage is different from an instant of time when the third top select line reaches its select voltage, and an instant of time when the second top select line reaches its select voltage is not earlier than the instant of time when the first top select line reaches its select voltage and not later than the instant of time when the third top select line reaches its select voltage.

18. The operating method of claim 17, wherein dynamically adjusting the application approach of the select voltage on the second top select line depending on the distance between the selected word line and the third top select line comprises:

based on the distance between the selected word line and the third top select line being less than a first preset distance, controlling the instant of time when the second top select line reaches its select voltage to be the same as the instant of time when the third top select line reaches its select voltage; and based on the distance between the selected word line and the third top select line being greater than a second preset distance, controlling the instant of time when the second top select line reaches its select voltage to be the same as the instant of time when the first top select line reaches its select voltage, wherein the second preset distance is greater than or equal to the first preset distance.

19. The operating method of claim 18, wherein the memory device further comprises a top select line isolation structure, wherein the top select line isolation structure penetrates the first top select line and partially penetrates the second top select line, and the deeper a depth of the top select line isolation structure penetrating the second top select line, the larger a value of the corresponding second preset distance.

20. The operating method of claim 18, further comprising:

based on the distance between the selected word line and the third top select line being less than the first preset distance, a voltage magnitude of the select voltage applied to the second top select line is the same as a voltage magnitude of the select voltage applied to the third top select line; and based on the distance between the selected word line and the third top select line being greater than the second preset distance, the voltage magnitude of the select voltage applied to the second top select line is the same as a voltage magnitude of the select voltage applied to the first top select line.

* * * * *